US012648411B2

(12) United States Patent
Chuang et al.

(10) Patent No.: US 12,648,411 B2
(45) Date of Patent: Jun. 2, 2026

(54) METHOD OF MANUFACTURING SEMICONDUCTOR STRUCTURE USING MULTI-LAYER HARD MASK

(71) Applicant: NANYA TECHNOLOGY CORPORATION, New Taipei City (TW)

(72) Inventors: Ying-Cheng Chuang, Taoyuan City (TW); Yu-Ting Lin, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 477 days.

(21) Appl. No.: 18/195,498

(22) Filed: May 10, 2023

(65) Prior Publication Data

US 2024/0014040 A1     Jan. 11, 2024

Related U.S. Application Data

(62) Division of application No. 17/859,208, filed on Jul. 7, 2022, now Pat. No. 12,482,657.

(51) Int. Cl.
H10P 76/40          (2026.01)
H10P 14/40          (2026.01)
(Continued)

(52) U.S. Cl.
CPC .......... H10P 76/405 (2026.01); H10P 14/416 (2026.01); H10P 50/242 (2026.01);
(Continued)

(58) Field of Classification Search
CPC ........... H01L 21/0332; H01L 21/76816; H01L 21/3081; H01L 21/76897
See application file for complete search history.

(56) References Cited

U.S. PATENT DOCUMENTS

2012/0208361 A1     8/2012   Ha
2016/0254153 A1     9/2016   Park et al.
(Continued)

FOREIGN PATENT DOCUMENTS

TW          202141573 A     11/2021
TW          202207308 A      2/2022

OTHER PUBLICATIONS

Office Action and and the search report mailed on Apr. 15, 2025 related to Taiwanese Application No. 112140911.
(Continued)

*Primary Examiner* — Chad M Dicke
*Assistant Examiner* — Dave Tan
(74) *Attorney, Agent, or Firm* — Xuan Zhang

(57)          ABSTRACT

The present disclosure provides a method of manufacturing a semiconductor structure. A substrate is provided. A multi-layer structure is formed over the substrate, wherein the multi-layer structure includes a semiconductive material layer and an oxide layer over the semiconductive material layer. The oxide layer is patterned to form a first patterned layer. A second patterned layer is formed on the semiconductive material layer and alternately arranged with the first patterned layer. A first etching operation is performed on the substrate using a comprehensive pattern of the first patterned layer and the second patterned layer.

9 Claims, 31 Drawing Sheets

S1

| Providing a substrate | ⌐ S11 |

| Forming a multi-layer structure over the substrate, wherein the multi-layer structure includes a semiconductive material layer and an oxide layer over the semiconductive material layer | ⌐ S12 |

| Patterning the oxide layer to form a first patterned layer | ⌐ S13 |

| Forming a second patterned layer on the semiconductive material layer, wherein the second patterned layer is alternately arranged with the first patterned layer | ⌐ S14 |

| Performing a first etching operation on the substrate using a comprehensive pattern of the first patterned layer and the second patterned layer | ⌐ S15 |

(51) Int. Cl.

| | |
|---|---|
| *H10P 50/00* | (2026.01) |
| *H10P 50/24* | (2026.01) |
| *H10P 50/26* | (2026.01) |
| *H10P 50/28* | (2026.01) |
| *H10P 76/20* | (2026.01) |
| *H10W 20/00* | (2026.01) |

(52) U.S. Cl.
CPC .......... *H10P 50/266* (2026.01); *H10P 50/283* (2026.01); *H10P 50/287* (2026.01); *H10P 50/71* (2026.01); *H10P 50/73* (2026.01); *H10P 76/2043* (2026.01); *H10P 76/4085* (2026.01); *H10W 20/056* (2026.01); *H10W 20/089* (2026.01)

(56) References Cited

U.S. PATENT DOCUMENTS

| | | | |
|---|---|---|---|
| 2018/0005874 A1 | 1/2018 | Mignot et al. | |
| 2018/0033612 A1 | 2/2018 | Lee et al. | |
| 2019/0035638 A1 | 1/2019 | Fan et al. | |
| 2019/0252312 A1 | 8/2019 | Yu et al. | |
| 2020/0105528 A1 | 4/2020 | Hsiao et al. | |
| 2021/0043500 A1* | 2/2021 | Lin | H01L 21/76811 |
| 2021/0272808 A1 | 9/2021 | Hsiao et al. | |
| 2021/0398858 A1* | 12/2021 | Pan | G11C 5/025 |
| 2022/0059349 A1 | 2/2022 | Kuo et al. | |
| 2022/0102150 A1* | 3/2022 | Tung | H10P 50/692 |
| 2022/0102201 A1 | 3/2022 | Abraham | |
| 2022/0102210 A1* | 3/2022 | Nyhus | H01L 21/76816 |
| 2022/0246479 A1 | 8/2022 | Huang et al. | |
| 2022/0367475 A1* | 11/2022 | Wei | H10B 12/315 |

OTHER PUBLICATIONS

Summary translation of Office Action and and the search report mailed on Apr. 15, 2025 related to Taiwanese Application No. 112140911.

Office Action and and the search report mailed on May 29, 2025 related to U.S. Appl. No. 17/859,208.

Office Action and the search report mailed on Oct. 17, 2023 related to Taiwanese Application No. 112100436.

* cited by examiner

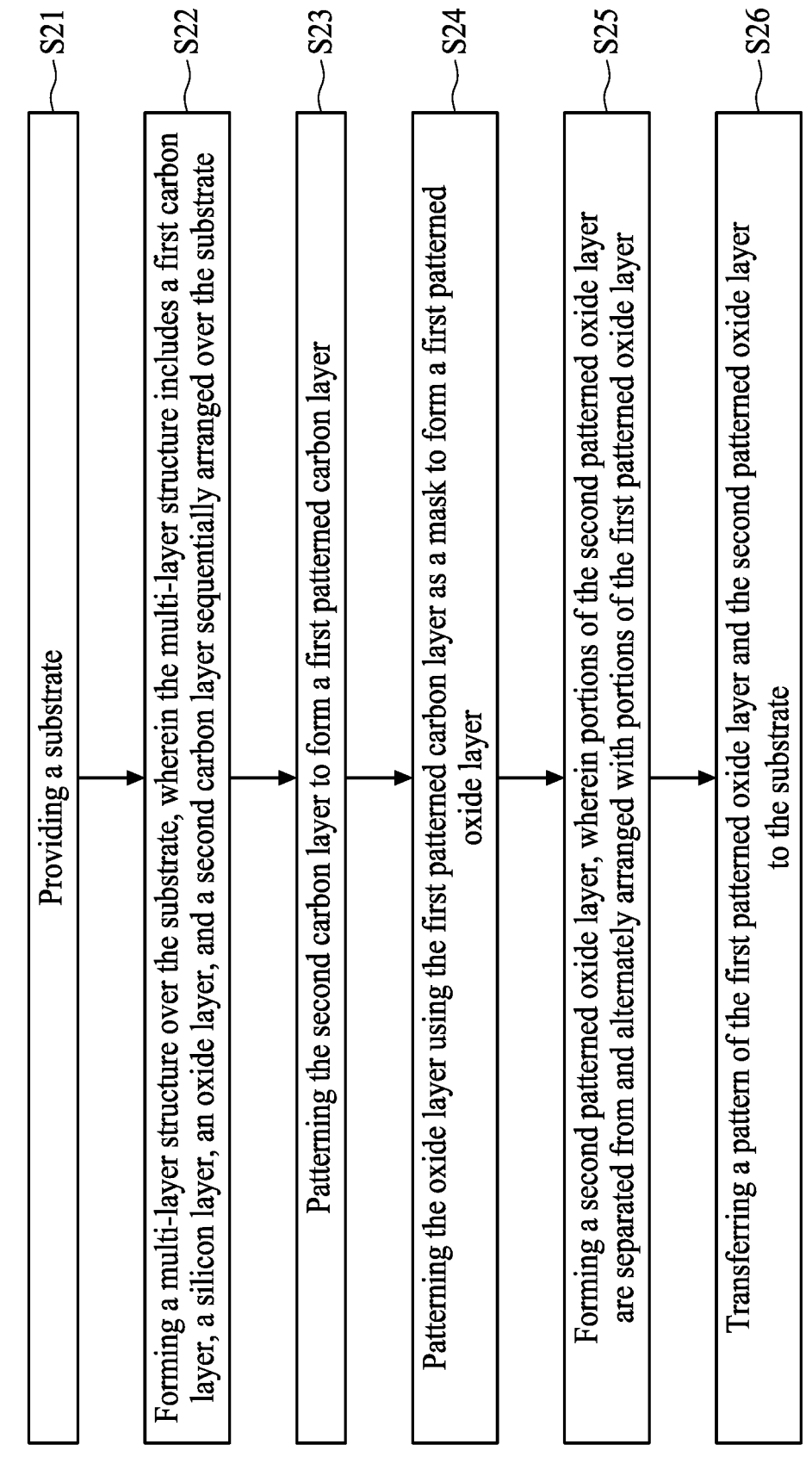

S2

S21 — Providing a substrate

S22 — Forming a multi-layer structure over the substrate, wherein the multi-layer structure includes a first carbon layer, a silicon layer, an oxide layer, and a second carbon layer sequentially arranged over the substrate S23 — Patterning the second carbon layer to form a first patterned carbon layer S24 — Patterning the oxide layer using the first patterned carbon layer as a mask to form a first patterned oxide layer S25 — Forming a second patterned oxide layer, wherein portions of the second patterned oxide layer are separated from and alternately arranged with portions of the first patterned oxide layer S26 — Transferring a pattern of the first patterned oxide layer and the second patterned oxide layer to the substrate

FIG. 2

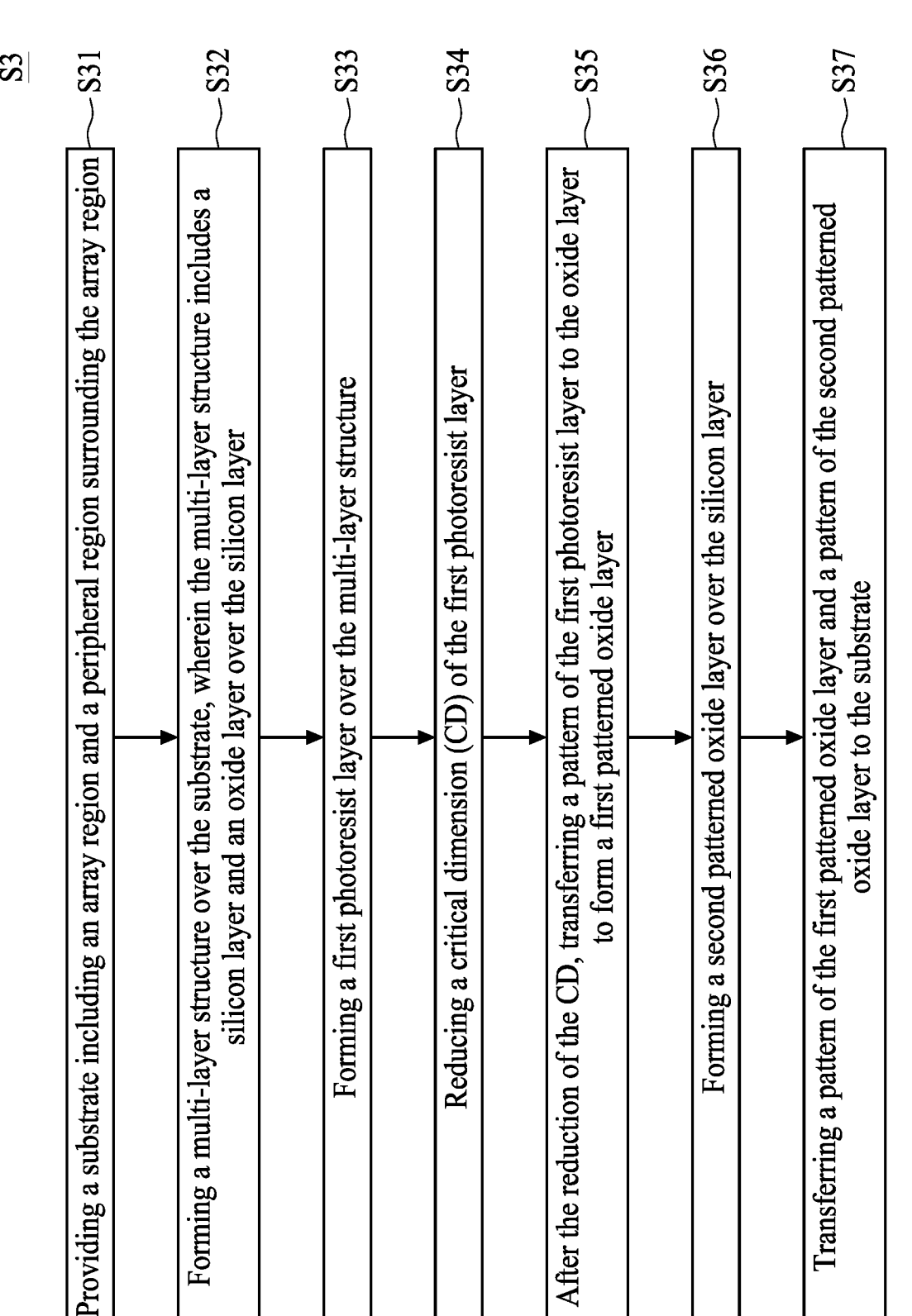

S3

S31 Providing a substrate including an array region and a peripheral region surrounding the array region S32 Forming a multi-layer structure over the substrate, wherein the multi-layer structure includes a silicon layer and an oxide layer over the silicon layer S33 Forming a first photoresist layer over the multi-layer structure S34 Reducing a critical dimension (CD) of the first photoresist layer S35 After the reduction of the CD, transferring a pattern of the first photoresist layer to the oxide layer to form a first patterned oxide layer S36 Forming a second patterned oxide layer over the silicon layer S37 Transferring a pattern of the first patterned oxide layer and a pattern of the second patterned oxide layer to the substrate

FIG. 3

METHOD OF MANUFACTURING SEMICONDUCTOR STRUCTURE USING MULTI-LAYER HARD MASK

CROSS-REFERENCE TO RELATED APPLICATION

This application is a divisional application of U.S. Non-Provisional application Ser. No. 17/859,208 filed 7 Jul. 2022, which is incorporated herein by reference in its entirety.

TECHNICAL FIELD

The present disclosure relates to a method of manufacturing a semiconductor structure. Particularly, the present disclosure relates to an improved technique for patterning processes.

DISCUSSION OF THE BACKGROUND

Semiconductor devices are used in a variety of electronic applications, such as personal computers, cellular phones, digital cameras, and other electronic equipment. The semiconductor devices are typically fabricated by sequentially depositing insulating or dielectric layers, conductive layers, and semiconductive layers of material over a semiconductor substrate, and patterning the various material layers using lithography to form circuit components and elements thereon. As the semiconductor industry has progressed into advanced technology process nodes in pursuit of greater device density, higher performance, and lower costs, challenges of precise control of lithography across a wafer have arisen.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a method for manufacturing a semiconductor structure. The method includes a number of operations. A substrate is provided. A multi-layer structure is formed over the substrate, wherein the multi-layer structure includes a semiconductive material layer and an oxide layer over the semiconductive material layer. The oxide layer is patterned to form a first patterned layer. A second patterned layer is formed on the semiconductive material layer and alternately arranged with the first patterned layer. A first etching operation is performed on the substrate using a comprehensive pattern of the first patterned layer and the second patterned layer.

In some embodiments, the semiconductive material layer includes amorphous silicon.

In some embodiments, the formation of the multi-layer structure comprises: forming a first carbon layer over the substrate; forming the semiconductive material layer over the first carbon layer; forming the oxide layer over the semiconductive material layer; and forming a second carbon layer over the oxide layer.

In some embodiments, a thickness of the first carbon layer is greater than a thickness of the second carbon layer.

In some embodiments, the thickness of the second carbon layer is greater than a thickness of the semiconductive layer or a thickness of the oxide layer.

In some embodiments, the method further comprises: forming a plurality of recesses on portions of the semiconductive material layer exposed through the first patterned layer prior to the formation of the second patterned layer.

In some embodiments, a depth of the plurality of recesses is in a range of 3 to 5 nanometers.

In some embodiments, the method further comprises: forming a conformal layer over the first patterned layer and the semiconductive material layer; and performing a third etching operation to reduce a thickness of each of horizontal portions of the conformal layer.

In some embodiments, a thickness of the conformal layer is in a range of 10 to 20 nanometers.

In some embodiments, a thickness of each of the horizontal portions of the conformal layer after the third etching operation is in a range of 3 to 5 nanometers.

In some embodiments, the method further comprises: forming a dielectric layer over the conformal layer, wherein the dielectric layer fills spaces between portions of the first patterned layer; performing a fourth etching operation to remove portions of the dielectric layer above a top surface of the first patterned layer to form the second patterned layer; and removing vertical portions of the conformal layer.

In some embodiments, portions of the conformal layer above the top surface of the first patterned layer are removed by the fourth etching operation.

In some embodiments, portions of the conformal layer above the top surface of the first patterned layer are removed concurrently with the removal of the vertical portions of the conformal layer.

In some embodiments, the second patterned layer is separated from the semiconductive material layer by the conformal layer.

In some embodiments, the second patterned layer is separated from the first patterned layer by a distance of 10 to 20 nanometers.

In some embodiments, a top surface of the first patterned layer and a top surface of the second patterned layer are substantially coplanar.

In some embodiments, a thickness of the first patterned layer is substantially greater than a thickness of the second patterned layer.

In some embodiments, a difference between a thickness of the first patterned layer and a thickness of the second patterned layer is in a range of 3 to 5 nanometers.

In some embodiments, the second patterned layer and the first patterned layer include a same dielectric material.

Another aspect of the present disclosure provides a method for manufacturing a semiconductor structure. The method includes a number of operations. A substrate is provided. A multi-layer structure is formed over the substrate, wherein the multi-layer structure includes a first carbon layer, a silicon layer, an oxide layer, and a second carbon layer sequentially arranged over the substrate. The second carbon layer is patterned to form a first patterned carbon layer. The oxide layer is patterned using the first patterned carbon layer as a mask to form a first patterned oxide layer. A second patterned oxide layer is formed, wherein portions of the second patterned oxide layer are separated from and alternately arranged with portions of the first patterned oxide layer. A pattern of the first patterned oxide layer and the second patterned oxide layer is transferred to the substrate.

In some embodiments, the transfer of the pattern comprises: patterning the silicon layer using the first patterned oxide layer and the second patterned oxide layer as a mask to form a patterned silicon layer; patterning the first carbon layer using the patterned silicon layer as a mask to form a second patterned carbon layer; and patterning the substrate using the second patterned carbon layer as a mask.

In some embodiments, the silicon layer includes amorphous silicon.

In some embodiments, the transfer of the pattern comprises: performing a first etching operation to form a first trench within a silicon material of the substrate; and performing a second etching operation to form a second trench within a dielectric material of the substrate.

In some embodiments, a first depth of the first trench is substantially less than a second depth of the second trench.

In some embodiments, the method further comprises: forming a dielectric layer lining the first trench; and depositing a conductive material in the first trench and the second trench.

In some embodiments, the method further comprises: removing an upper portion of the conductive material to form a plurality of contacts in the first trench and the second trench; forming a nitride layer over the conductive material; and forming an oxide layer over the nitride layer.

In some embodiments, the nitride layer fills the first trench and the second trench above the plurality of contacts.

In some embodiments, a thickness of the first carbon layer is substantially greater than a thickness of the silicon layer or a thickness of the oxide layer.

Another aspect of the present disclosure provides a method for manufacturing a semiconductor structure. The method includes a number of operations. A substrate including an array region and a peripheral region surrounding the array region is provided. A multi-layer structure is formed over the substrate, wherein the multi-layer structure includes a silicon layer and an oxide layer over the silicon layer. A first photoresist layer is formed over the multi-layer structure. A critical dimension (CD) of the first photoresist layer is reduced. After the reduction of the CD, a pattern of the first photoresist layer is transferred to the oxide layer to form a first patterned oxide layer. A second patterned oxide layer is formed over the silicon layer. A pattern of the first patterned oxide layer and a pattern of the second patterned oxide layer are transferred to the substrate.

In some embodiments, the reduction of the CD includes performing a tilt etching operation.

In some embodiments, the method further comprises: forming a nitride layer over the substrate prior to the formation of the multi-layer structure.

In some embodiments, a first width of a first portion of the first photoresist layer in the peripheral region is less than a second width of a second portion of the first photoresist layer in the array region.

In some embodiments, the method further comprises: forming a second photoresist layer over portions of the first patterned oxide layer and portions of the second patterned oxide layer in the peripheral region prior to the transfer of the pattern of the first patterned oxide layer and the pattern of the second patterned oxide layer to the substrate.

In some embodiments, a thickness of the oxide layer is in a range of 40 to 80 nanometers, and a thickness of the silicon layer is in a range of 30 to 70 nanometers.

In some embodiments, the multi-layer structure further includes a carbon layer and an anti-reflective coating (ARC) layer sequentially arranged over the oxide layer.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

FIG. 2 is a flow diagram illustrating a method of manufacturing a semiconductor structure in accordance with some embodiments of the present disclosure.

FIG. 3 is a flow diagram illustrating a method of manufacturing a semiconductor structure in accordance with some embodiments of the present disclosure.

DETAILED DESCRIPTION

Figure 1:
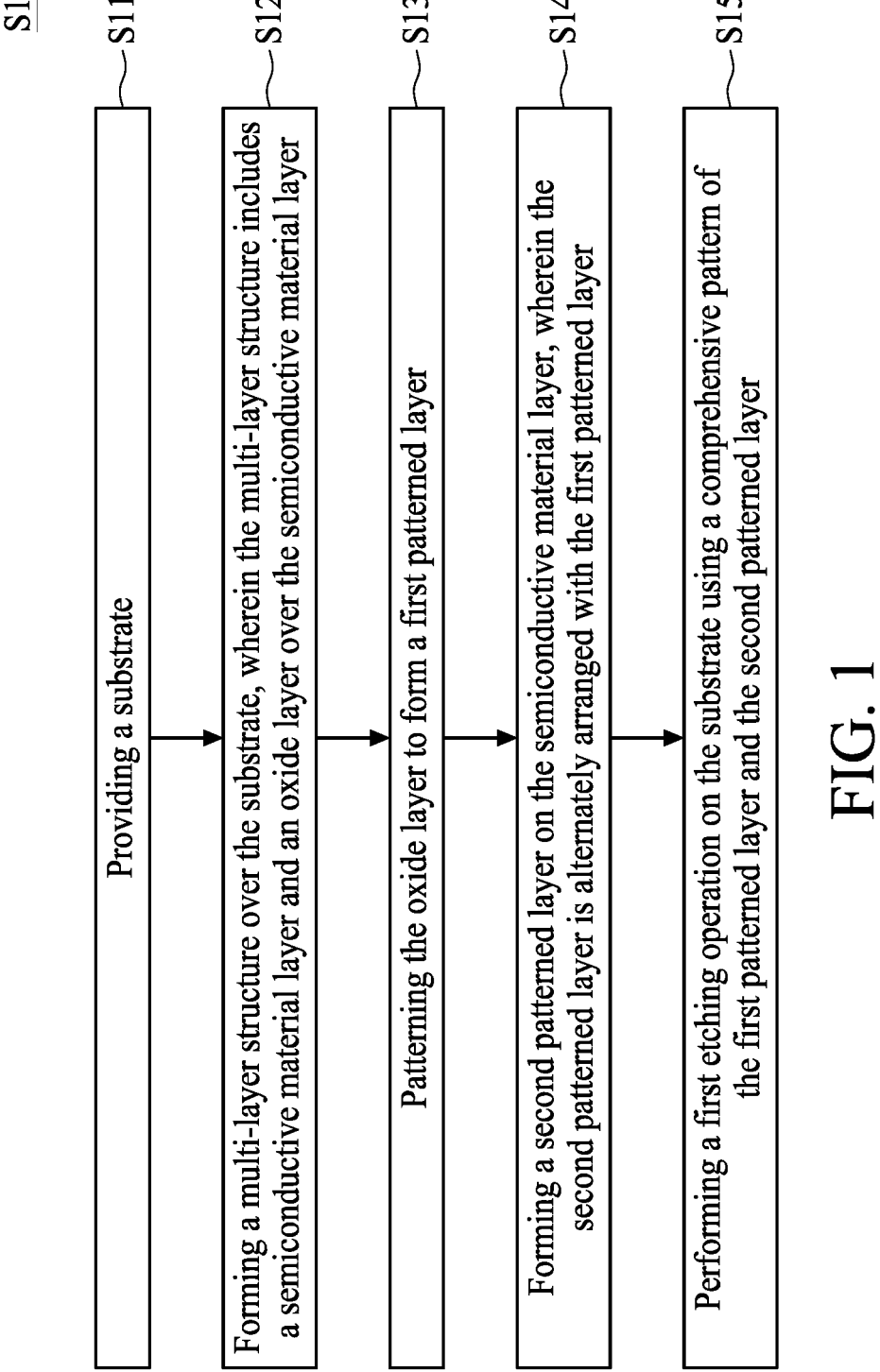
FIG. 1 is a flow diagram illustrating a method of manufacturing a semiconductor structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

As the semiconductor industry has progressed into advanced technology process nodes in pursuit of greater device density, it has reached an advanced precision of photolithography. In order to further reduce device sizes, dimensions of elements and distances between different elements have to be proportionally reduced. However, with the reductions in the dimensions of the elements and the distances between different elements, challenges of precise control on the dimensions and the distances have arisen. For instance, a landing pad can be disconnected by a sharp corner of a bit line structure after an etching operation.

In order to reduce device sizes further still, a double patterning technique has been developed in which multiple hard layers are patterned at a same elevation to compose one pattern to be transferred to a target layer. The multiple hard layers undergo multiple operations, such as deposition, etching, planarization and so forth, and the pattern formed by the multiple hard layers may have an issue of wiggling patterns. The wiggling patterns of the multiple hard layers result in a poor patterning result of the target layer. The present disclosure relates to a method for manufacturing a semiconductor structure. In particular, the method of the present disclosure is able to provide a novel combination of a multiple hard layers so as to avoid the issue of wiggling patterns. A performance of a device formed according to the method and a product yield can thereby be improved.

FIG. 1 is a flow diagram illustrating a method S1 for manufacturing a semiconductor device in accordance with some embodiments of the present disclosure. The method S1 includes a number of operations (S11, S12, S13, S14, and S15) and the description and illustration are not deemed as a limitation to the sequence of the operations. In the operation S11, a substrate is provided. In the operation S12, a multi-layer structure is formed over the substrate, wherein the multi-layer structure includes a semiconductive material layer and an oxide layer over the semiconductive material layer. In the operation S13, the oxide layer is patterned to form a first patterned layer. In the operation S14, a second patterned layer is formed on the semiconductive material layer, wherein the second patterned layer is alternately arranged with the first patterned layer. In the operation S15, a first etching operation is performed on the substrate using a comprehensive pattern of the first patterned layer and the second patterned layer. It should be noted that the operations of the method S1 may be rearranged or otherwise modified within the scope of the various aspects. Additional processes may be provided before, during, and after the method S1, and some other processes may be only briefly described herein. Thus, other implementations are possible within the scope of the various aspects described herein.

FIG. 2 is a flow diagram illustrating a method S2 for manufacturing a semiconductor device in accordance with some embodiments of the present disclosure. The method S2 includes a number of operations (S21, S22, S23, S24, S25 and S26) and the description and illustration are not deemed as a limitation to the sequence of the operations. In the operation S21, a substrate is provided. In the operation S22, a multi-layer structure is formed over the substrate, wherein the multi-layer structure includes a first carbon layer, a silicon layer, an oxide layer, and a second carbon layer sequentially arranged over the substrate. In the operation S23, the second carbon layer is patterned to form a first patterned carbon layer. In the operation S24, the oxide layer is patterned using the first patterned carbon layer as a mask to form a first patterned oxide layer. In the operation S25, a second patterned oxide layer is formed, wherein portions of the second patterned oxide layer are separated from and alternately arranged with portions of the first patterned oxide layer. In the operation S26, a pattern of the first patterned oxide layer and the second patterned oxide layer is transferred to the substrate. It should be noted that the operations of the method S2 may be rearranged or otherwise modified within the scope of the various aspects. Additional processes may be provided before, during, and after the method S2, and some other processes may be only briefly described herein. Thus, other implementations are possible within the scope of the various aspects described herein.

FIG. 3 is a flow diagram illustrating a method S3 for manufacturing a semiconductor device in accordance with some embodiments of the present disclosure. The method S3 includes a number of operations (S31, S32, S33, S34, S35, S36 and S37) and the description and illustration are not deemed as a limitation to the sequence of the operations. In the operation S31, a substrate including an array region and a peripheral region surrounding the array region is provided. In the operation S32, a multi-layer structure is formed over the substrate, wherein the multi-layer structure includes a silicon layer and an oxide layer over the silicon layer. In the operation S33, a first photoresist layer is formed over the multi-layer structure. In the operation S34, a critical dimension (CD) of the first photoresist layer is reduced. In the operation S35, after the reduction of the CD, a pattern of the first photoresist layer is transferred to the oxide layer to form a first patterned oxide layer. In the operation S36, a second patterned oxide layer is formed over the silicon layer. In the operation S37, a pattern of the first patterned oxide layer and a pattern of the second patterned oxide layer are transferred to the substrate. It should be noted that the operations of the method S3 may be rearranged or otherwise modified within the scope of the various aspects. Additional processes may be provided before, during, and after the method S3, and some other processes may be only briefly described herein. Thus, other implementations are possible within the scope of the various aspects described herein.

The method S1, the method S2 and the method S3 are within a same concept of the present disclosure, and in order to further illustrate details of the method S1, the method S2, the method S3, and the concept of the present disclosure, the method S1, the method S2 and the method S3 are comprehensively described with embodiments of the present disclosure.

FIGS. 4 to 32 are schematic diagrams illustrating various fabrication stages constructed according to the method S1, S2 or S3 for manufacturing a semiconductor structure 10 in accordance with some embodiments of the present disclosure. The stages shown in FIGS. 4 to 32 are also illustrated schematically in the process flow in FIG. 1, 2 or 3. In the subsequent discussion, the fabrication stages shown in FIGS. 4 to 32 are discussed in reference to the process steps in FIG. 1, 2 or 3.

Figure 4:
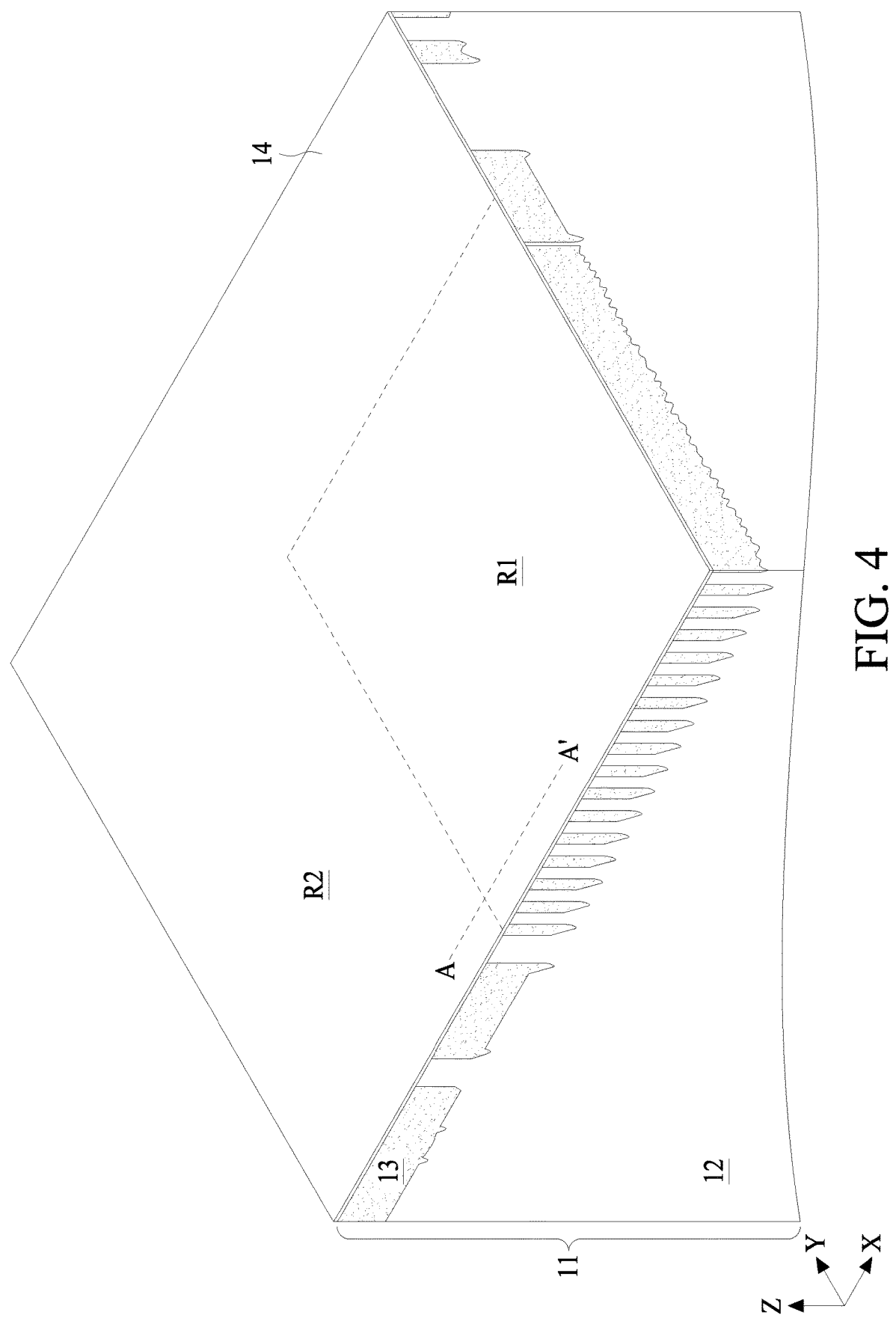
FIG. 4 is a schematic 3D diagram of an intermediate stage in formation of a semiconductor structure in accordance with some embodiments of the present disclosure.
Figure 5:
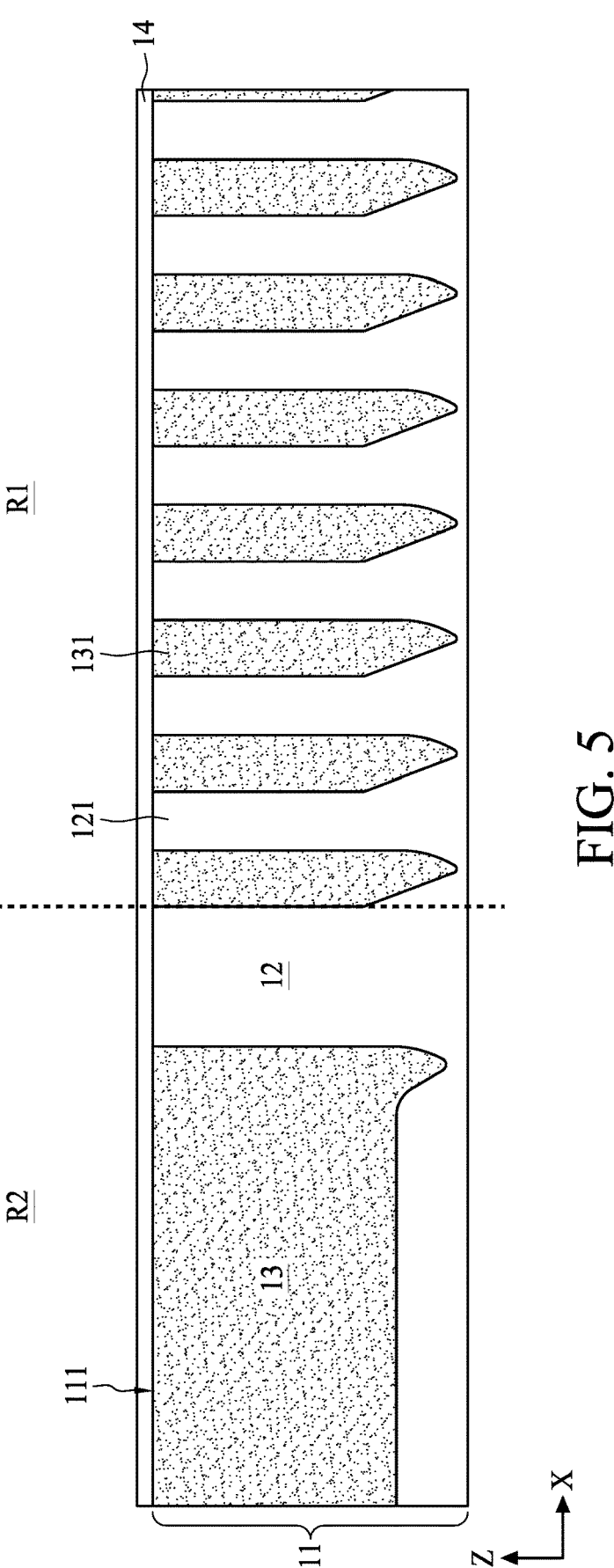
FIGS. 5 to 7 are cross-sectional diagrams of intermediate stages along a line A-A' shown in FIG. 4 in the formation of the semiconductor structure in accordance with some embodiments of the present disclosure.

Referring to FIGS. 4 and 5, FIG. 4 is a schematic 3D diagram at a stage of the method S1, the method S2 and/or the method S3 and FIG. 5 is a schematic cross-sectional diagram along a line A-A' in FIG. 4 in accordance with some embodiments of the present disclosure. In the operation S11, the operation S21 and/or the operation S31, a substrate 11 is provided, received, or formed.

In some embodiments, the substrate 11 may have a multilayer structure, or the substrate 11 may include a multilayer compound semiconductor structure. In some embodiments, the substrate 11 includes semiconductor devices, electrical components, electrical elements or a combination thereof. In some embodiments, the substrate 11 includes transistors or functional units of transistors. In some embodiments, the substrate 11 includes active components, passive components, and/or conductive elements. The active components may include a memory die (e.g., a dynamic random-access memory (DRAM) die, a static random-access memory (SRAM) die, etc.), a power management die (e.g., a power management integrated circuit (PMIC) die), a logic die (e.g., system-on-a-chip (SoC), a central processing unit (CPU), a graphics processing unit (GPU), an application processor (AP), a microcontroller, etc.), a radio frequency (RF) die, a sensor die, a micro-electro-mechanical-system (MEMS) die, a signal processing die (e.g., a digital signal processing (DSP) die), a front-end die (e.g., an analog front-end (AFE) die) or other active components. Each of the active components may include multiple transistors. The transistors can include planar transistors, multi-gate transistors, gate-all-around field-effect transistors (GAAFET), fin field-effect transistors (FinFET), vertical transistors, nanosheet transistors, nanowire transistors, or a combination thereof. The passive components may include a capacitor, a resistor, an inductor, a fuse or other passive components. The conductive elements may include metal lines, metal islands, conductive vias, contacts or other conductive elements.

The active components, passive components, and/or conductive elements as mentioned above can be formed in and/or over a semiconductor substrate. The semiconductor substrate may be a bulk semiconductor, a semiconductor-on-insulator (SOI) substrate, or the like. The semiconductor substrate can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable materials; or a combination thereof. In some embodiments, the alloy semiconductor substrate may be a SiGe alloy with a gradient Si:Ge feature in which Si and Ge compositions change from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy.

For a purpose of simplicity, the substrate 11 depicted in FIG. 4 can be a topmost portion of a multilayer structure of the substrate 11. The substrate 11 may include an array region R1 and a peripheral region R2 surrounding the array region R1. In some embodiments, the active components or the transistors are mostly formed in the array region R1, and the peripheral region R2 is for circuit routing and may include passive components. In some embodiments, the substrate 11 includes a silicon material 12 and a dielectric material 13. The dielectric material 13 may include multiple dielectric portions 131, and the dielectric portions 131 become multiple isolations in the silicon material 12. In some embodiments, the dielectric portions 131 may have a pillar-like configuration and may be inserted into the silicon material 12 to define multiple pillar-like silicon portions 121 alternately arranged with the multiple dielectric portions 131. In some embodiments as shown in FIGS. 4 and 5, the dielectric portions 131 and the silicon portions 121 extend from a top surface 111 of the substrate 11.

Memory cells or devices may be formed in the array region R1 of the substrate 11 (not shown). For a purpose of illustration, the figures show a portion of the substrate 11 above the memory cells or memory devices, and word line (WL) metals are formed in subsequent processing in the topmost portion of the substrate 11 shown in FIGS. 4 and 5. In some embodiments, the dielectric portions 131 and the silicon portions 121 extend along a Y direction in the array region R1. In some embodiments, multiple word line metals extending along the Y direction are formed in the array region R1 for electrical connection to the memory cells or memory devices.

An insulating layer 14 may be formed over the top surface 111 of the substrate 11 after the operation S11, S21 or S31. In some embodiments, the insulating layer 14 is conformal to the top surface 111 of the substrate 11. In some embodiments, the insulating layer 14 is in contact with the substrate 11. In some embodiments, the insulating layer 14 is formed in the array region R1 and the peripheral region R2. In some embodiments, the insulating layer 14 includes nitride such as silicon oxide. In some embodiments, the insulating layer 14 is formed using a chemical vapor deposition (CVD) process or any other suitable process. In some embodiments, a thickness of the insulating layer 14 is in a range of 5 to 30 nanometers (nm).

Figure 6:
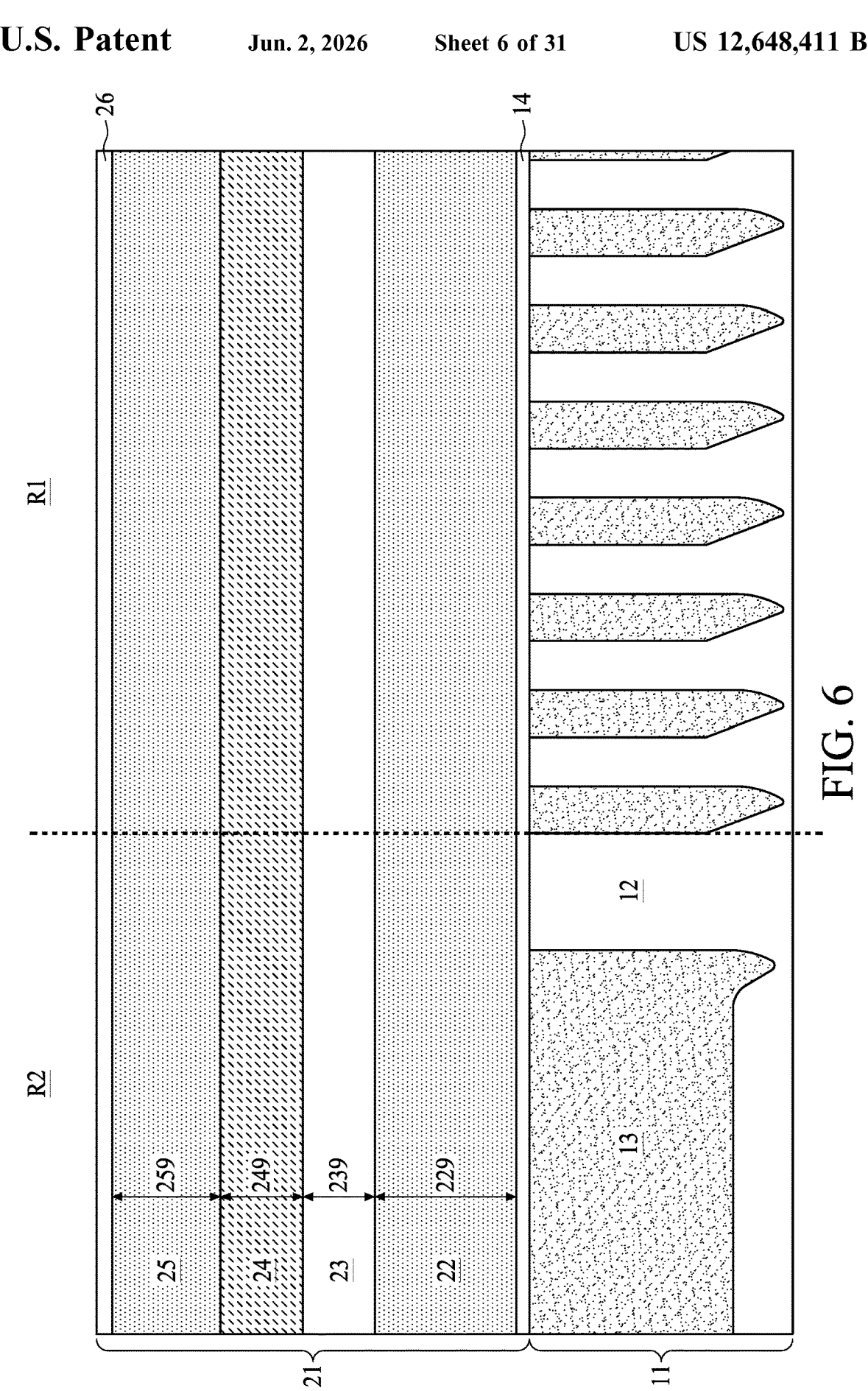

Referring to FIG. 6, FIG. 6 is a schematic cross-sectional diagram along the line A-A' in FIG. 4 at a stage of the method S1, the method S2 and/or the method S3 in accordance with some embodiments of the present disclosure. In the operation S12, the operation S22 and/or the operation S32, a multi-layer structure 21 is formed over the substrate 11 and the insulating layer 14.

The multi-layer structure 21 can be a hard-mask structure and may include several layers stacked over each other. In some embodiments, the multi-layer structure 21 includes a first layer 22, a second layer 23, a third layer 24, a fourth layer 25 and a fifth layer 26. In some embodiments, the first layer 22, the second layer 23, the third layer 24, and the fourth layer 25 are sequentially formed over the insulating layer 14.

In some embodiments, the first layer 22 is disposed on the insulating layer 14. In some embodiments, the first layer 22 includes carbon. In some embodiments, the first layer 22 is formed by a CVD process or any other suitable process. In some embodiments, the second layer 23 is disposed over the first layer 22. In some embodiments, the second layer 23 includes semiconductive material, such as silicon. In some embodiments, the second layer 23 includes amorphous silicon. In some embodiments, the second layer 23 is formed by a CVD process or any other suitable process. In some embodiments, the first layer 22 and the second layer 23 have compositions different from each other to enable selective etching of each relative to the other.

In some embodiments, the third layer 24 is disposed on the second layer 23. In some embodiments, the third layer 24 includes oxide, such as silicon oxide. In some embodiments, the third layer 24 is formed by a CVD process or any other suitable process. In some embodiments, the fourth layer 25 is disposed on the third layer 24. In some embodiments, the fourth layer 25 includes carbon. In some embodiments, the fourth layer 25 is formed by a CVD process or any other suitable process. In some embodiments, the deposition of the third layer 24 and the fourth layer 25 may be performed in-situ to save processing time and reduce possibility of contamination. As used herein, the term "in-situ" is used to refer to processes in which the substrate 111 being processed is not exposed to an external ambient (e.g., external to the processing system) environment.

In some embodiments, the fifth layer 26 is disposed on the fourth layer 25. In some embodiments, the fifth layer 26 includes dielectric material such as nitride or oxynitride. In some embodiments, the fifth layer 26 is an antireflective coating (ARC) layer. In some embodiments, the fifth layer 26 may be formed by a plasma-enhanced CVD (PECVD) process. The multi-layer structure 21 functions as a hard mask to define a pattern of the WL metals in the substrate 11. In some embodiments, the fifth layer 26 is a topmost layer of the multi-layer structure 21 and formed prior to formation of a photoresist layer. In some embodiments, the fifth layer 26 is formed between the fourth layer 25 and a first photoresist layer 31 in order to eliminate problems associated with reflection of light when exposing the first photoresist layer 31. In some embodiments, the fifth layer 26 may stabilize an etching selectivity of the fourth layer 25.

A thickness 229 of the first layer 22 may be greater than a thickness 259 of the fourth layer 25. The thickness 259 of the fourth layer 25 may be greater than a thickness 249 of the third layer 24 or a thickness 239 of the second layer 23. In some embodiments, the thickness 249 of the third layer 24 is substantially greater than or equal to the thickness 239 of the second layer 23. In some embodiments, the thickness 229 of the first layer 22 is in a range of 100 to 200 nm. In some embodiments, the thickness 239 of the second layer 23 is in a range of 40 to 80 nm. In some embodiments, the thickness 249 of the third layer 24 is in a range of 40 to 100 nm. In some embodiments, the thickness 259 of the fourth layer 25 is in a range of 50 to 150 nm. In some embodiments, a thickness of the fifth layer 26 is in a range of 10 to 30 nm.

Figure 7:
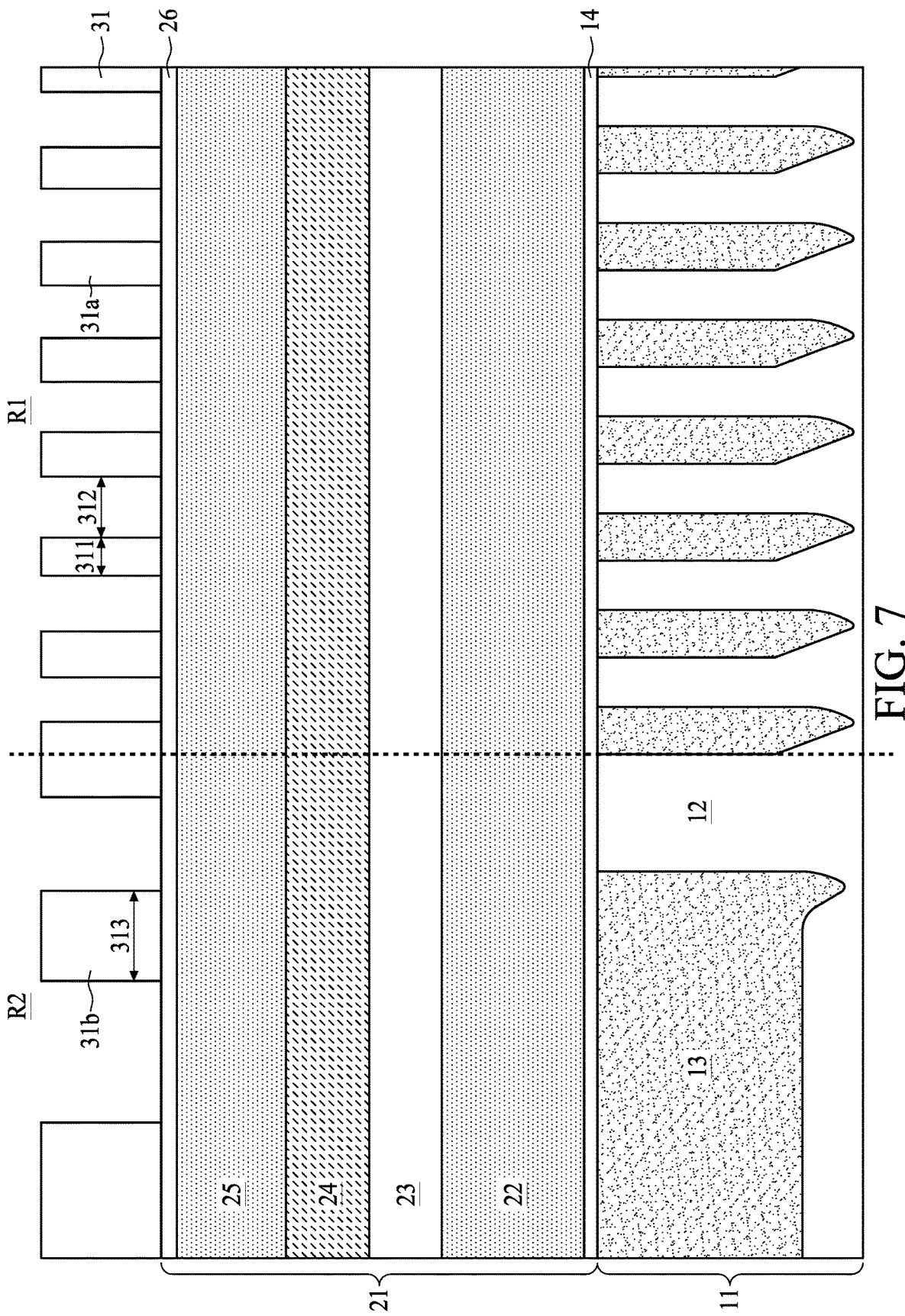

Referring to FIG. 7, FIG. 7 is a schematic cross-sectional diagram along the line A-A' in FIG. 4 at a stage of the method S1, the method S2 and/or the method S3 in accordance with some embodiments of the present disclosure. The multi-layer structure 21 is patterned according to the method S1, the method S2 and/or the method S3. Prior to the operation S13, prior to the operation S23 and/or in the operation S33, the first photoresist layer 31 is formed over the multi-layer structure 21.

In some embodiments, after the formation of the multi-layer structure 21, pre-cleaning, photoresist application (e.g., formation of a layer of photoresist material), exposure and developing are sequentially performed to form the first photoresist layer 31. In some embodiments, the first photoresist layer 31 includes several slots 31a in the array region R1 and one or more slots 31b in the peripheral region R2 over the multi-layer structure 21. In some embodiments, a width 313 of a slot 31b is greater than a width 311 of a slot 31a of the first photoresist layer 31. In some embodiments, the slots 31a of the first photoresist layer 31 in the array region R1 are configured to define the WL metals in the array region R1. In some embodiments, the width 311 of a slot 31a of the first photoresist layer 31 is in a range of 30 to 40 nm. In some embodiments, a distance 312 is defined between adjacent slots 31a in the array region R1 and is in a range of 30 to 40 nm.

Figure 8:
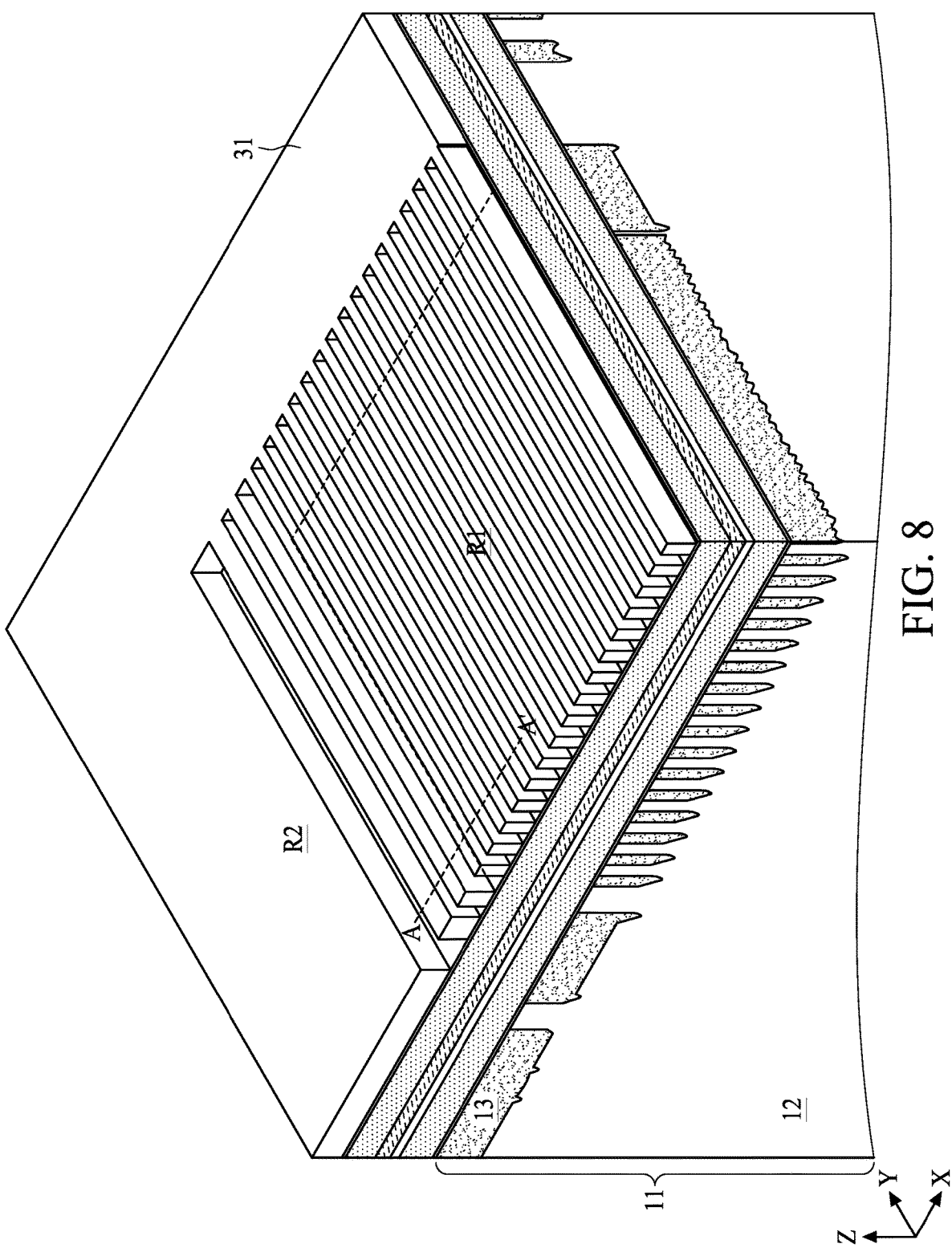
FIG. 8 is a schematic 3D diagram of an intermediate stage in the formation of the semiconductor structure in accordance with some embodiments of the present disclosure.

Referring to FIG. 8, FIG. 8 is a schematic 3D diagram of FIG. 7 in accordance with some embodiments of the present disclosure. In some embodiments, the slots 31a and 31b of the first photoresist layer 31 extend along the Y direction. In some embodiments, the slots 31a of the first photoresist layer 31 extend into the peripheral region R2 along the Y direction. For a purpose of illustration of a concept of the present disclosure, only a portion of the first photoresist layer 31 in the array region R1 is featured in the following description.

Figure 9:
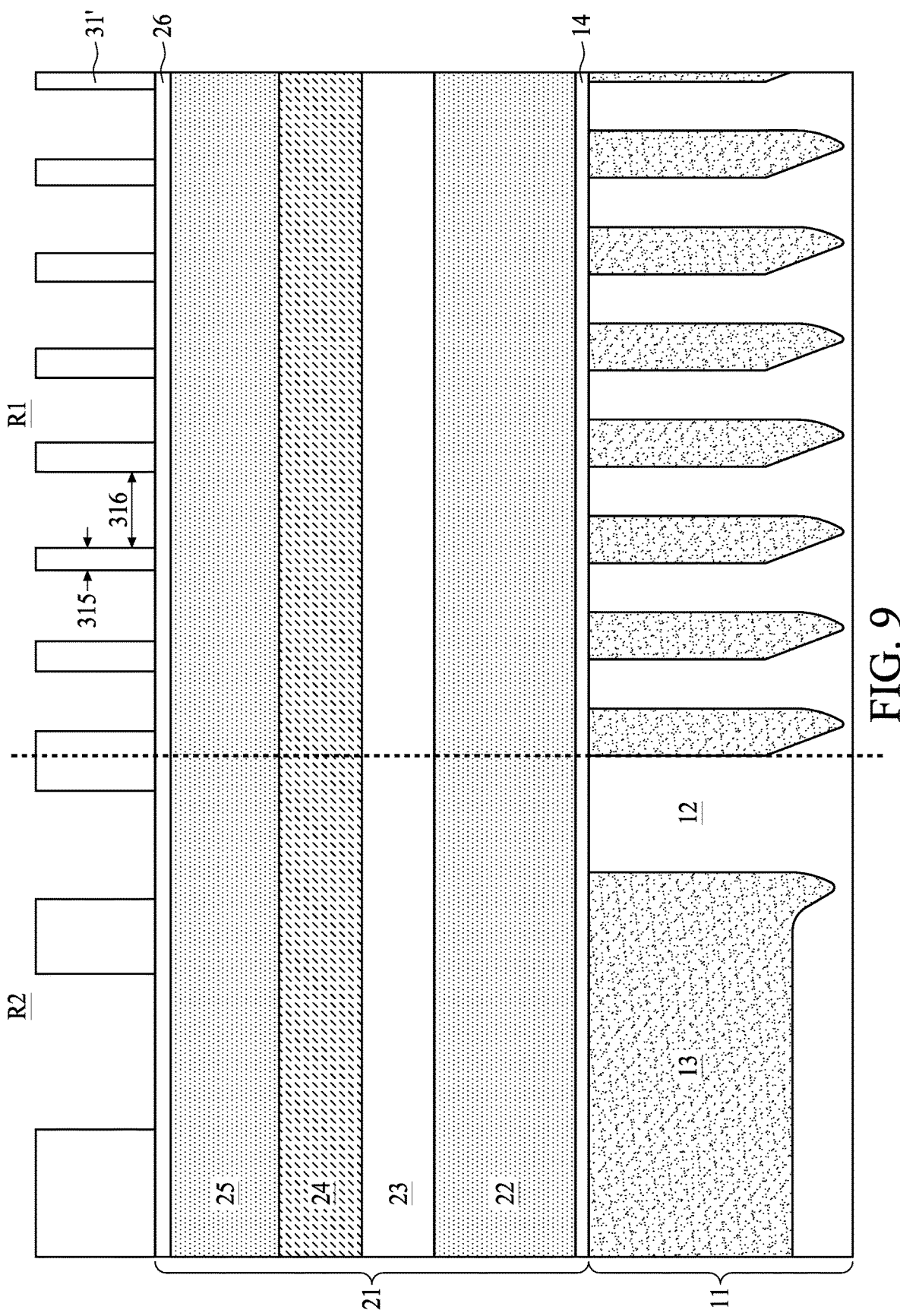
FIGS. 9 to 19 are cross-sectional diagrams of intermediate stages along a line A-A' shown in FIG. 4 in the formation of the semiconductor structure in accordance with some embodiments of the present disclosure.

Referring to FIG. 9, FIG. 9 is a schematic cross-sectional diagram along the line A-A' in FIG. 8 at a stage of the method S1, the method S2 and/or the method S3 in accordance with some embodiments of the present disclosure. Prior to the operation S13, prior to the operation S23 and/or in the operation S34, a critical dimension (CD) of the first photoresist layer 31 is reduced. The CD may be a general term to descript a width of each of the slots 31a and 31b. For instance, the CD of the first photoresist layer 31 in the array region R1 is equal to the width 311 as shown FIG. 7. In some embodiments, an etching operation and/or another suitable process is performed to reduce the CD of the photoresist layer 31. In some embodiments, the etching operation includes a directional dry etch, tilt etching, or other suitable processing. As used herein, the process of reduction of a CD of a photoresist layer (e.g., the first photoresist layer 31) may be referred to as a photoresist post trimming process.

For ease of understanding, the first photoresist layer 31 is labeled 31' in the figures after the photoresist post trimming process. In some embodiments, a CD of a slot 31a of the first photoresist layer 31' is reduced from the width 311 to a width 315. In some embodiments, the width 315 is in a range of 30 to 50 nm. In some embodiments, a distance between adjacent slots 31a of the first photoresist layer 31' is increased from the distance 312 to a distance 316.

Figure 10:
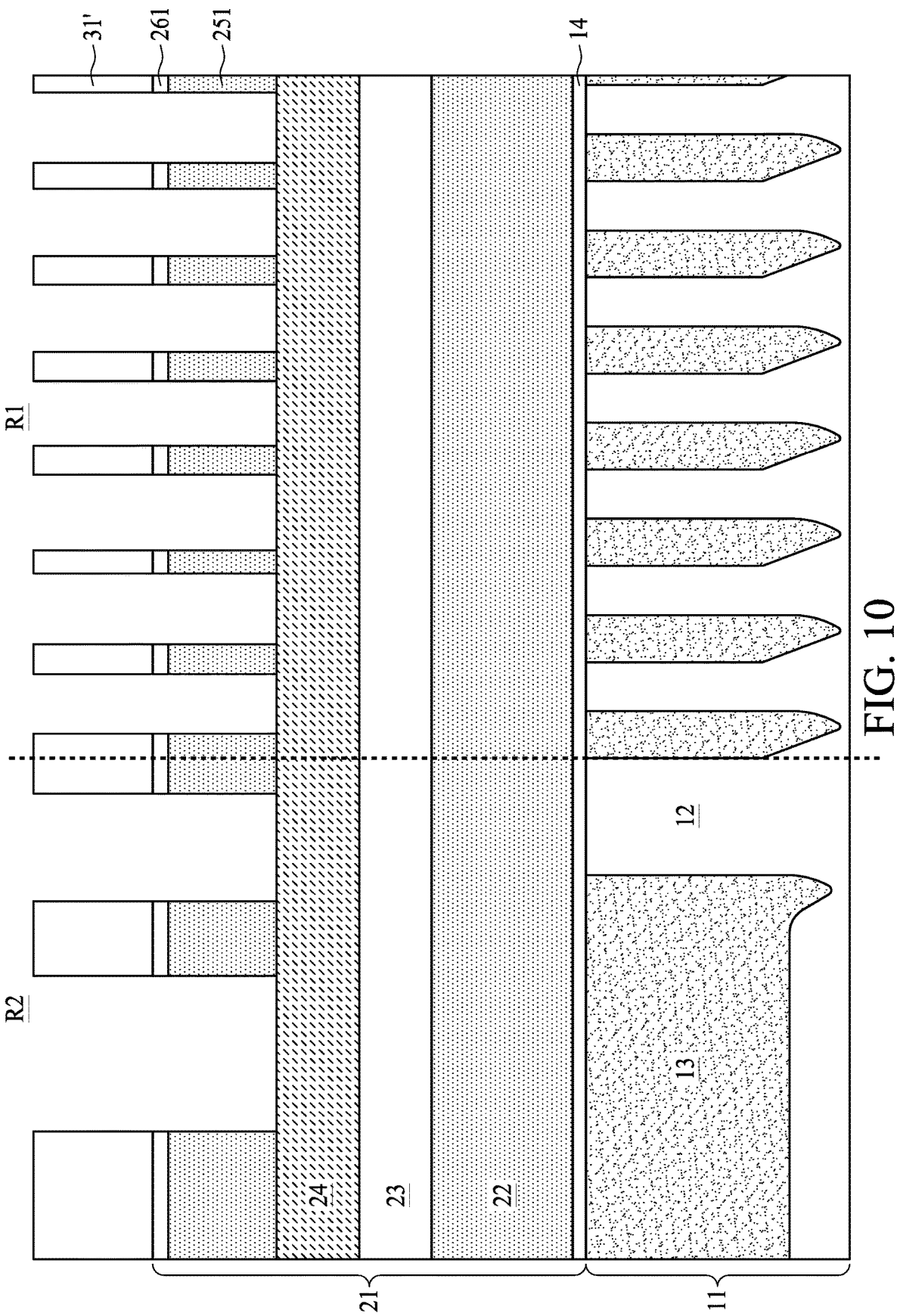

Referring to FIG. 10, FIG. 10 is a schematic cross-sectional diagram along the line A-A' in FIG. 8 at a stage of the method S1, the method S2 and/or the method S3 in accordance with some embodiments of the present disclosure. Prior to the operation S13, in the operation S23 and/or prior to the operation S35, the fifth layer 26 and the fourth layer 25 shown in FIG. 9 are patterned to form a fifth patterned layer 261 and the fourth patterned layer 251 shown in FIG. 10. In some embodiments, portions of the fifth layer 26 and the fourth layer 25 exposed through the first photoresist layer 31' are removed. A pattern of the first photoresist layer 31' is therefore transferred to the fourth layer 25. In some embodiments, a first etching operation or other suitable method is performed to remove the portions of the fifth layer 26 and the fourth layer 25 exposed through the first photoresist layer 31'. In some embodiments, an etchant of the first etching operation has a low selectivity to materials of the fifth layer 26 and the fourth layer 25.

Figure 11:
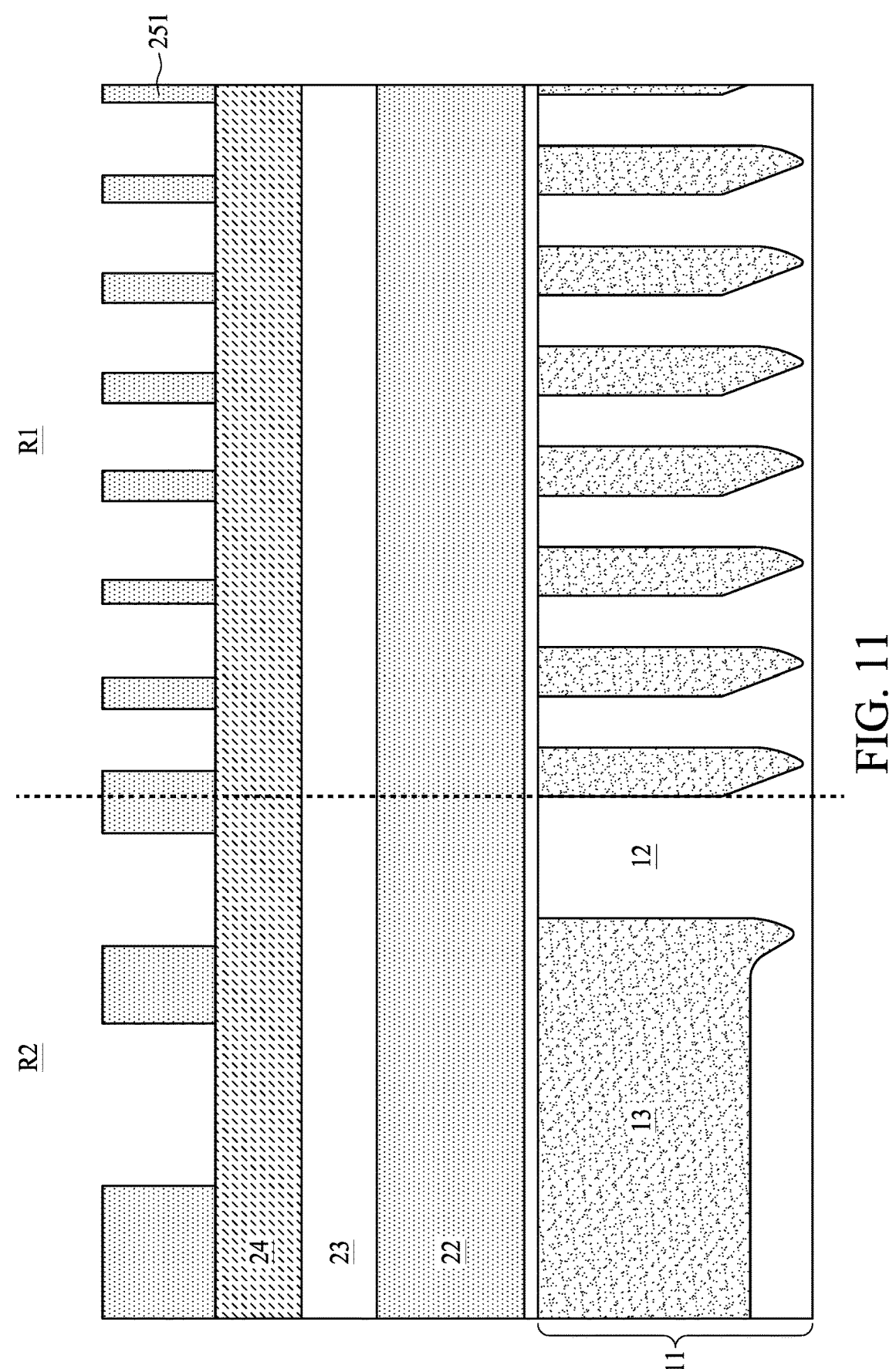

Referring to FIG. 11, FIG. 11 is a schematic cross-sectional diagram along the line A-A' in FIG. 8 at a stage of the method S1, the method S2 and/or the method S3 in accordance with some embodiments of the present disclosure. In some embodiments, after the removal of the portions of the fifth layer 26 and the fourth layer 25 exposed through the first photoresist layer 31', the first photoresist layer 31' and the remaining portion of the fifth patterned layer 261 are removed.

Figure 12:
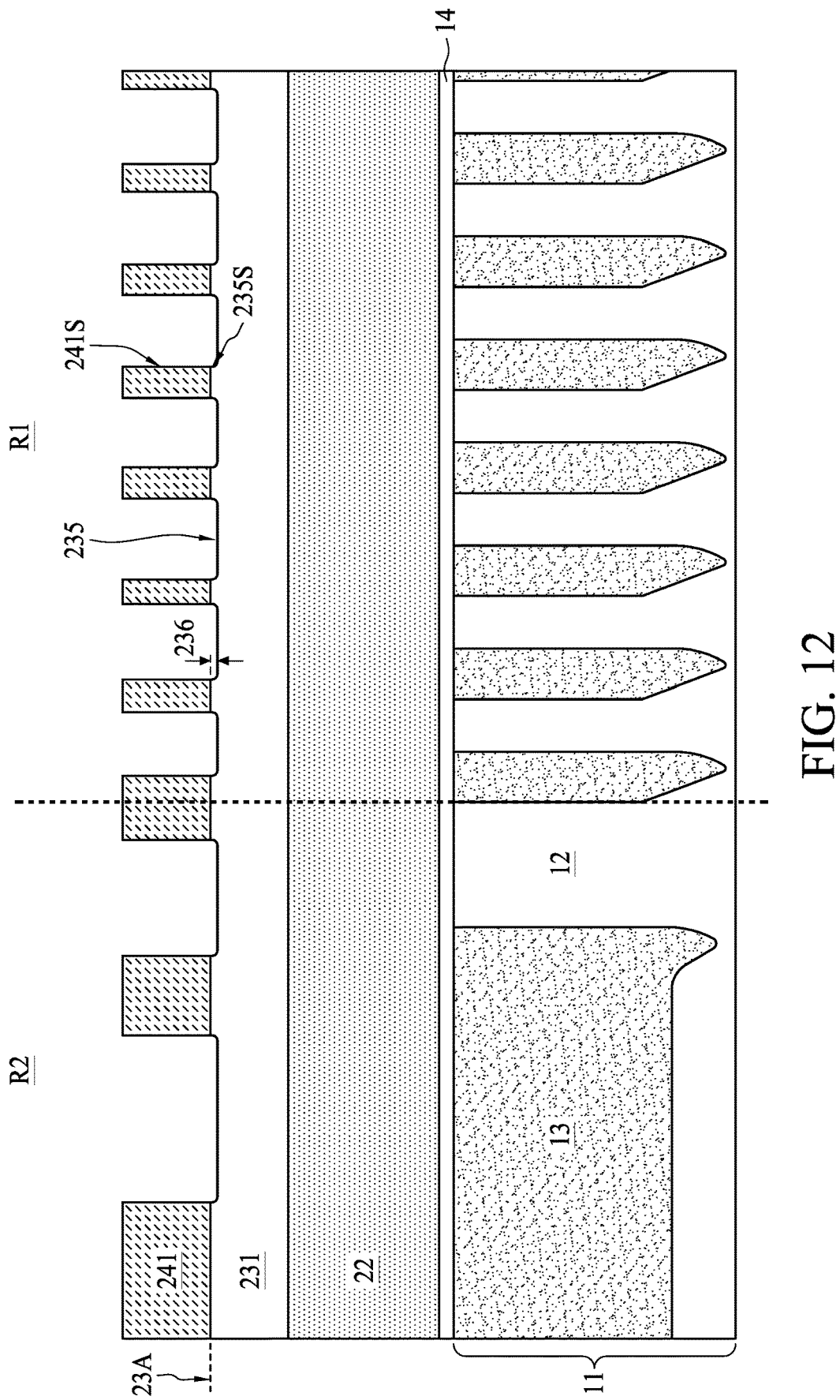

Referring to FIG. 12, FIG. 12 is a schematic cross-sectional diagram along the line A-A' in FIG. 8 at a stage of the method S1, the method S2 and/or the method S3 in accordance with some embodiments of the present disclosure. In the operation S13, operation S24 and/or the operation S35, the third layer 24 as shown in FIG. 11 is patterned to form a third patterned layer 241 as shown in FIG. 12.

The fourth patterned layer 251 in FIG. 11 is used as mask to pattern the third layer 24. A pattern of the fourth patterned layer 251 is therefore transferred to the third layer 24. In other words, the patterned of the first photoresist layer 31' is transferred to the third layer 24 via the patterning of the fourth layer 25. In some embodiments, a second etching operation or other suitable process is performed to remove the portions of the third layer 24 exposed through the fourth patterned layer 261 as shown in FIG. 11. In some embodiments, after the removal of the portions of the third layer 24 exposed through the fourth patterned layer 261, surficial portions of the second layer 23 exposed through the third patterned layer 241 are removed to form at least one recess 235 extending from a top surface 23A into the second layer 23. For a purpose of illustration and ease of understanding, the second layer 23 having the recess 235 is labeled 231 in the figures. In some embodiments, a sidewall 241S of a portion of the third patterned layer 241 is substantially aligned with a sidewall 235S of the recess 235. In some embodiments, formation of the recess 235 is a result of an overetch effect of the patterning of the third layer 24. In some embodiments, the recess 235 is formed by an etching operation targeting the second layer 23 using the third patterned layer 241 as a mask after the second etching operation. In some embodiments, a depth 236 is in a range of 1 to 10 nm. In some embodiments, the depth 236 is in a range of 3 to 5 nm.

Figure 13:
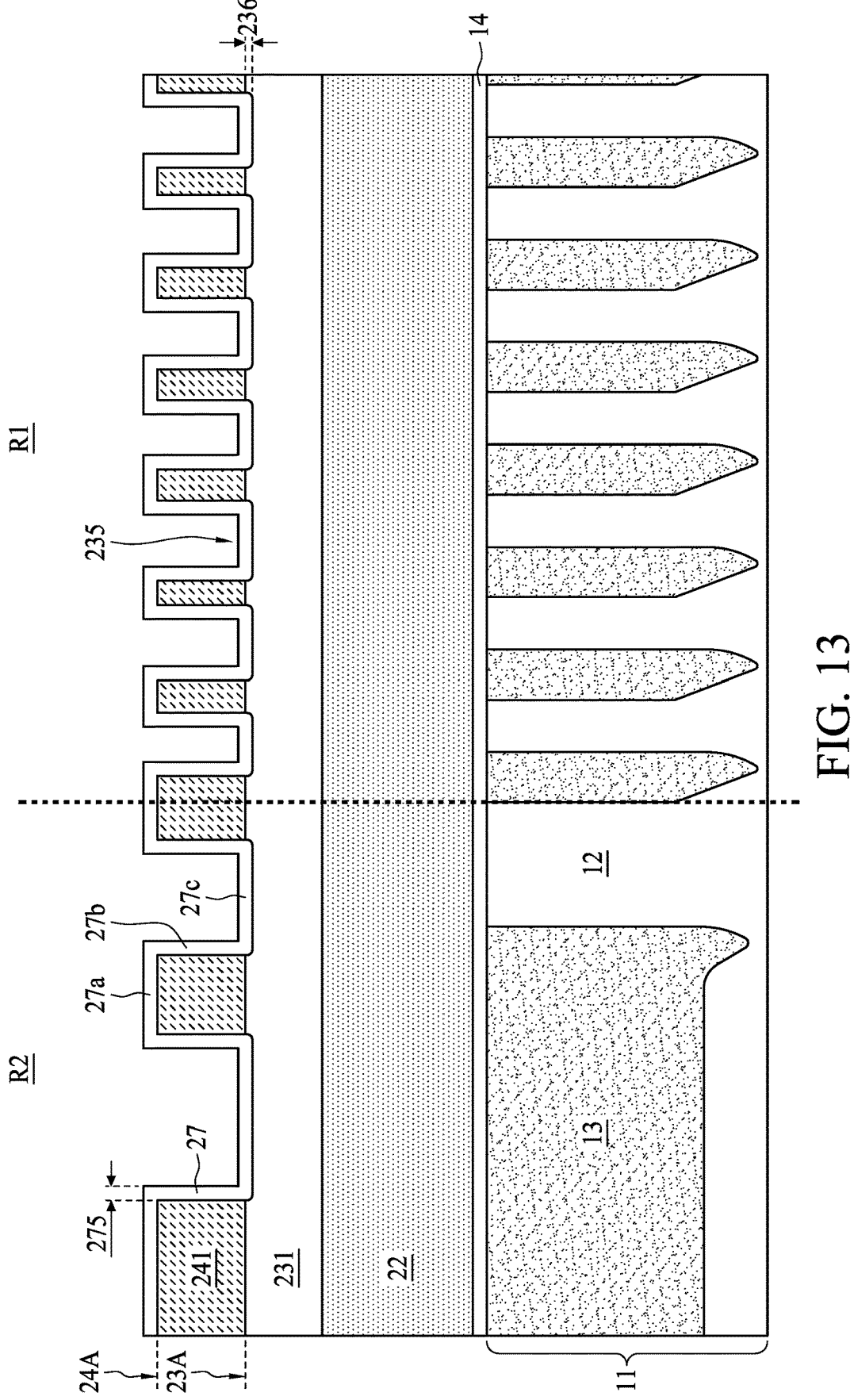

Referring to FIG. 13, FIG. 13 is a schematic cross-sectional diagram along the line A-A' in FIG. 8 at a stage of the method S1, the method S2 and/or the method S3 in accordance with some embodiments of the present disclosure. After the formation of the recess 235, a conformal layer 27 is formed over the third patterned layer 241 and the second layer 231. In some embodiments, a profile of the conformal layer 27 is conformal to a profile of the third patterned layer 241 and the second layer 231, and more specifically, conformal to the profile of the third patterned layer 241 and the recess 235.

In some embodiments, the conformal layer 27 includes a first horizontal portion 27a lining a top surface 24A of the third patterned layer 241, a second horizontal portion 27c lining the top surface 23A of the second layer 231 in the recess 235, and vertical portions 27b connecting the first horizontal portion 27a to the second horizontal portion 27c. In some embodiments, the vertical portion 27b lines the sidewall of 241S of the third patterned layer 241. In some embodiments, the conformal layer 27 is in contact with the top surface 24A of the third patterned layer 241, the sidewall of 241S of the third patterned layer 241, and the top surface 23A of the second layer 231.

In some embodiments, a thickness 275 of the conformal layer 27 is configured to define a distance between adjacent WL metals to be formed in the substrate 11, or a width of a gap between the third patterned layer 241 and a sixth patterned layer 281 to be formed in subsequent processing. In some embodiments, the second horizontal portions 27c at least fills the recess 235. In some embodiments, the second horizontal portion 27c of the conformal layer 27 is partially below the third patterned layer 241. In some embodiments, the thickness 275 of the conformal layer 27 is substantially consistent throughout the entire conformal layer 27. In some embodiments, the thickness 275 of the conformal layer 27 is substantially greater than the depth 236 of the recess 235. In some embodiments, the thickness 275 of the conformal layer 27 is in a range of 10 to 20 nm.

In some embodiments, the conformal layer 27 is formed by a chemical vapor deposition (CVD), a physical vapor deposition (PVD), an atomic layer deposition (ALD), a low-pressure chemical vapor deposition (LPCVD), a plasma-enhanced CVD (PECVD), or a combination thereof. In some embodiments, the conformal layer 27 includes one or more dielectric materials. In some embodiments, the dielectric material includes nitride, e.g., silicon nitride ($Si_xN_y$). In some embodiments, the dielectric material of the conformal layer 27 is different from that of the third patterned layer 241 for a purpose selective etching. In some embodiments, the third patterned layer 241 includes oxide, and the conformal layer 27 includes nitride.

Figure 14:
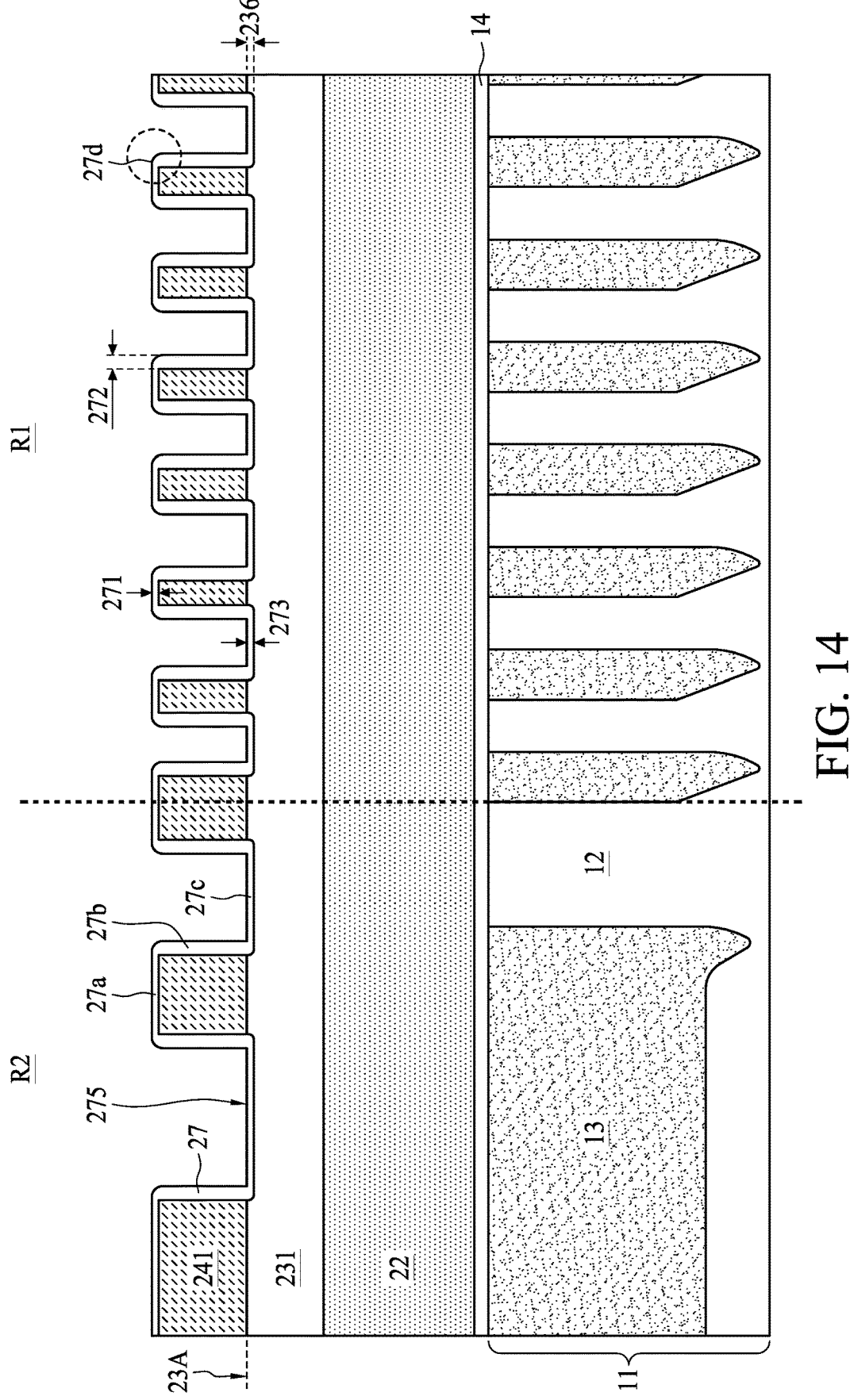

Referring to FIG. 14, FIG. 14 is a schematic cross-sectional diagram along the line A-A' in FIG. 8 at a stage of the method S1, the method S2 and/or the method S3 in accordance with some embodiments of the present disclosure. After the formation of the conformal layer 27, a third etching operation is performed to reduce thicknesses of the first horizontal portions 27a and the second horizontal portions 27c. In some embodiments, a directional dry etching operation is performed to reduce the thicknesses of the first horizontal portions 27a and the second horizontal portions 27c. In some embodiments, a thickness 271 of the first horizontal portion 27a and a thickness 273 of the second horizontal portion 27c are substantially equal. In some embodiments, the thickness 271 or the thickness 273 is in a range of 1 to 10 nm. In some embodiments, the thickness 271 or the thickness 273 is in a range of 3 to 5 nm. In some embodiments, rounded corners 27d of the vertical portions 27b of the conformal layer 27 are formed by the third etching operation.

The thickness 273 of the second horizontal portion 27c may be controlled to be substantially equal to the depth 236 of the recess 235. In some embodiments, a top surface 275 of the second horizontal portion 27c is substantially aligned with the top surface 23A of the second layer 231. In some embodiments, the top surface 275 of the second horizontal portion 27c is substantially coplanar with the top surface 23A of the second layer 231.

Figure 15:
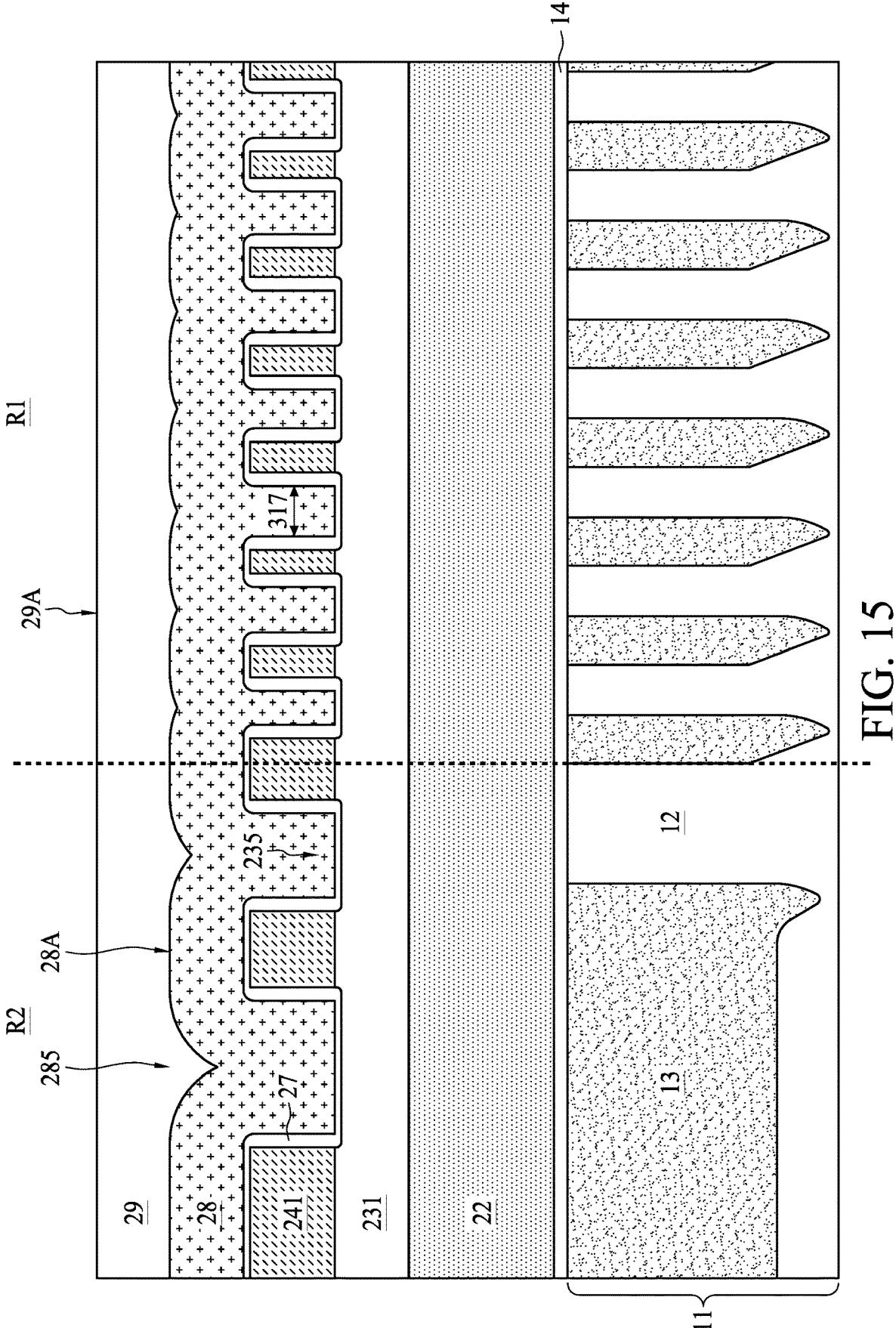

Referring to FIG. 15 FIG. 15 is a schematic cross-sectional diagram along the line A-A' in FIG. 8 at a stage of the method S1, the method S2 and/or the method S3 in accordance with some embodiments of the present disclosure. After the reduction of the thicknesses 271 and 273 of the horizontal portions 27a and 27c, a sixth layer 28 is formed over the conformal layer 27. In some embodiments, the sixth layer 28 is formed by a blanket deposition. In some embodiments, the sixth layer 28 at least fills spaces between portions of the third patterned layer 241.

In some embodiments, the sixth layer 28 is disposed over and between portions of the third patterned layer 241. In some embodiments, a thickness of the sixth layer 28 is substantially greater than one-half of a distance 317 between adjacent vertical portions 27b of the conformal layer 27 for a purpose of filling spaces between portions of the third patterned layer 241. In some embodiments, a top surface 28A of the sixth layer 28 is not a planar surface. In some embodiments, the top surface 28A of the sixth layer 28 includes a plurality of recesses 285 disposed over each of the recesses 235 due to a property of a deposition. In some embodiments, the recess 285 is vertically over a central region of a corresponding recess 235.

In some embodiments, a portion of the sixth layer 28 is disposed in the recess 235. In some embodiments, the sixth layer 28 is entirely above the recess 235 or the third patterned layer 241. In some embodiments, the formation of the sixth layer 28 includes a chemical vapor deposition (CVD), a physical vapor deposition (PVD), or a combination thereof. In some embodiments, the sixth layer 28 includes one or more dielectric materials. The dielectric material of the sixth layer 28 may be selected from oxide or nitride. In some embodiments, the dielectric material of the sixth layer 28 is the same as that of the third patterned layer 241 for a purpose of selective etching. In some embodiments, the sixth layer 28 includes oxide.

In some embodiments, a sacrificial layer 29 is formed over the sixth layer 28. In some embodiments, the sacrificial layer 29 is in physical contact with the top surface 28A of the sixth layer 28. In some embodiments, the sacrificial layer 29 fills the recesses 285. In some embodiments, a top surface 29A of the sacrificial layer 29 is substantially planar. In some embodiments, the sacrificial layer 29 is configured to provide a planar surface for an etching operation to be performed during subsequent processing in order to provide a better etching result. In some embodiments, the sacrificial layer 29 includes a dielectric material, an anti-reflective coating material, an oxide-containing material, or other suitable materials.

Figure 16:
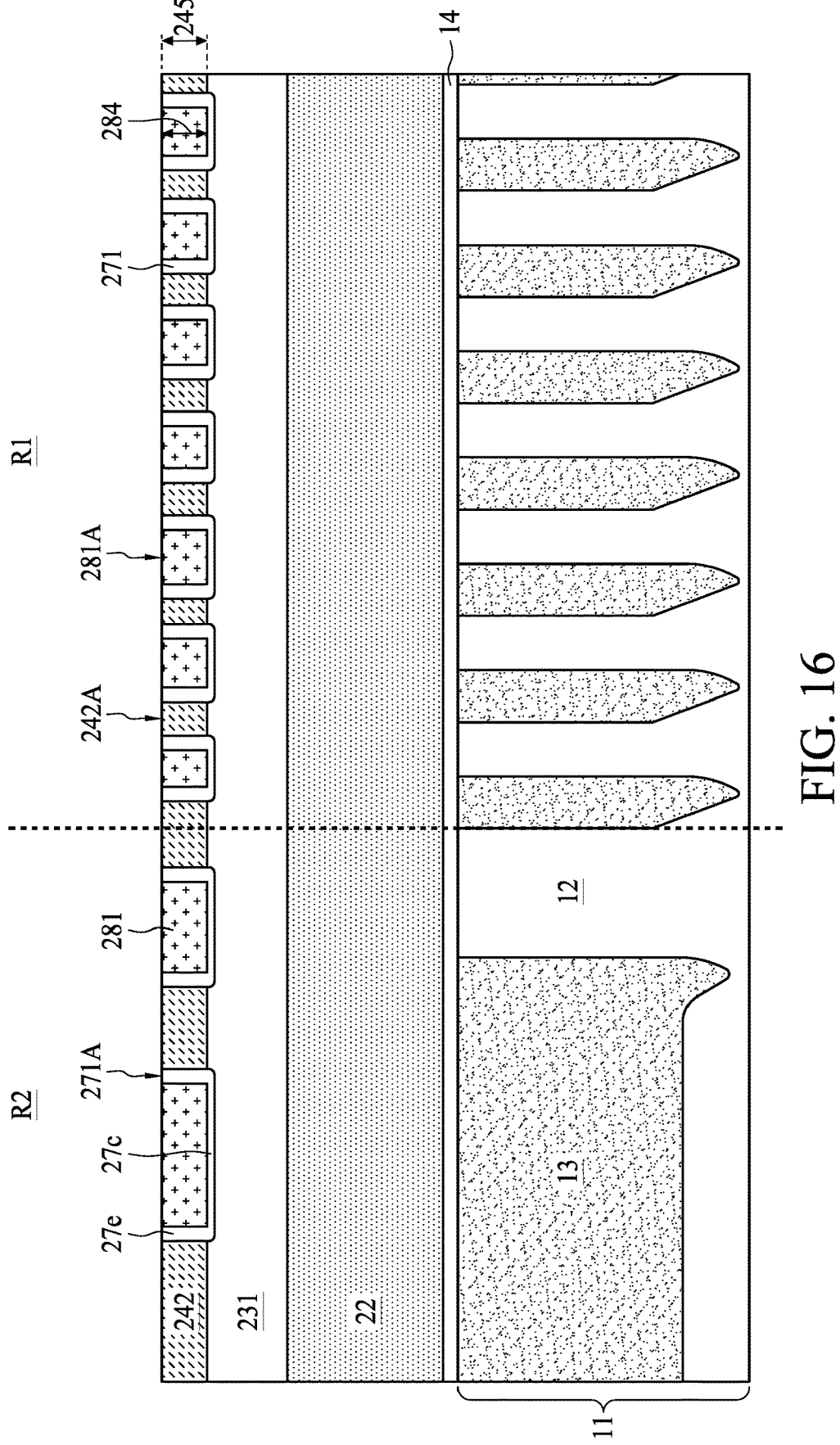
Figure 17:
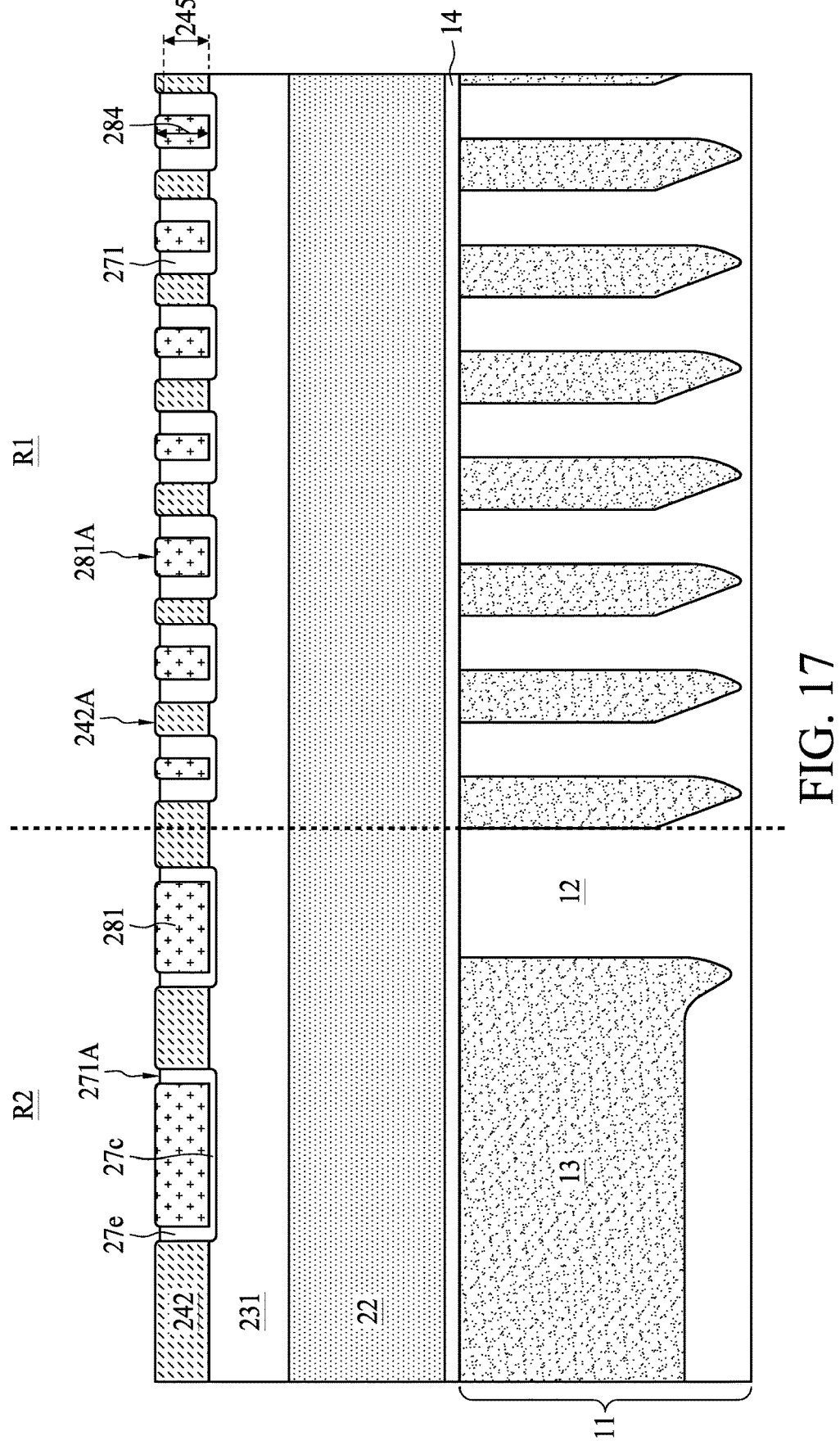

Referring to FIGS. 16 to 17, FIGS. 16 to 17 are schematic cross-sectional diagrams along the line A-A' in FIG. 8 at a stage of the method S1, the method S2 and/or the method S3 in accordance with different embodiments of the present disclosure. In the operation S14, the operation S25 and the operation S36, a sixth patterned layer 281 is formed over the second layer 231 and between the vertical portions 27b of the conformal layer 27.

In some embodiments, a fourth etching is performed to remove the first horizontal portions 27a of the conformal layer 27. In some embodiments, the fourth etching operation includes ion beam etching, directional dry etching, reactive ion etching, solution wet etching, or a combination thereof. In some embodiments, the fourth etching operation includes a low-selectivity etching. In some embodiments, the low-selectivity etching includes a low etching selectivity between two of the sacrificial layer 29, the sixth layer 28, the conformal layer 27, and the third patterned layer 241 shown in FIG. 15. In some embodiments, the low-selectivity etching includes an etching rate to the sixth layer 28 substantially equal to an etching rate to the conformal layer 27. In some embodiments, the etching rate of the low-selectivity etching to the conformal layer 27 is substantially equal to an etching rate of the low-selectivity etching to the third patterned layer 241. In some embodiments, the low-selectivity etching includes an oxide-to-nitride selectivity less than 3.

In some embodiments, a detection of a material of the conformal layer 27 at an etched surface is performed after a certain duration of the fourth etching operation. A result of the detection can indicate an exposure of the third patterned layer 241. In some embodiments, the fourth etching operation stops at the exposure of the third patterned layer 241. In some embodiments, the fourth etching operation is further performed for a certain length of time after the detection of the exposure of the third patterned layer 241 to ensure an entirety of the rounded corners 27d is removed for a purpose of a better patterning result. A patterned conformal layer 271 is thereby formed by the fourth etching operation. In some embodiments, the fourth etching operation stops when the rounded corners 27d of the conformal layer 13 are entirely removed. In some embodiments, upper portions of the third patterned layer 241 at a same horizontal level as the rounded corners 27d are removed to form a third patterned layer 242. In some embodiments, portions of the sixth layer 28 at the same horizontal level as the rounded corners 27d are removed to form the sixth patterned layer 281. A thickness 245 of the third patterned layer 242 can be substantially greater than, equal to, or less than a thickness 284 of the sixth patterned layer 281 depending on an overall depth of the second horizontal portion 27c and the recess 235. In some embodiments, the thickness 245 is substantially equal to the thickness 284 as shown in FIG. 16 or FIG. 17 due to the thickness 273 shown in FIG. 14 being controlled substantially equal to the depth 236.

In some embodiments as shown in FIG. 16, a top surface 271A of the patterned conformal layer 271, a top surface 242A of the third patterned layer 242 and a top surface 281A of the sixth patterned layer 281 are substantially coplanar as a result of the fourth etching operation. In some embodiments, as shown in FIG. 17, an over-etching effect may occur on the conformal layer 27, and the top surface 271A of the patterned conformal layer 271 may be slightly below the top surface 242A of the third patterned layer 242 or the top surface 281A of the sixth patterned layer 281. In alternative embodiments, the fourth etching operation stops at the exposure of the third patterned layer 241, and a fifth etching operation having a higher selectivity to the material of the conformal layer 27 can be performed after the fourth etching operation for a certain length of time to ensure entirety of the rounded corners 27d is removed. As a result, the top surface 271A of the patterned conformal layer 271 can be slightly below the top surface 242A of the third patterned layer 242 or the top surface 281A of the sixth patterned layer 281 as shown in FIG. 17.

Figure 18:
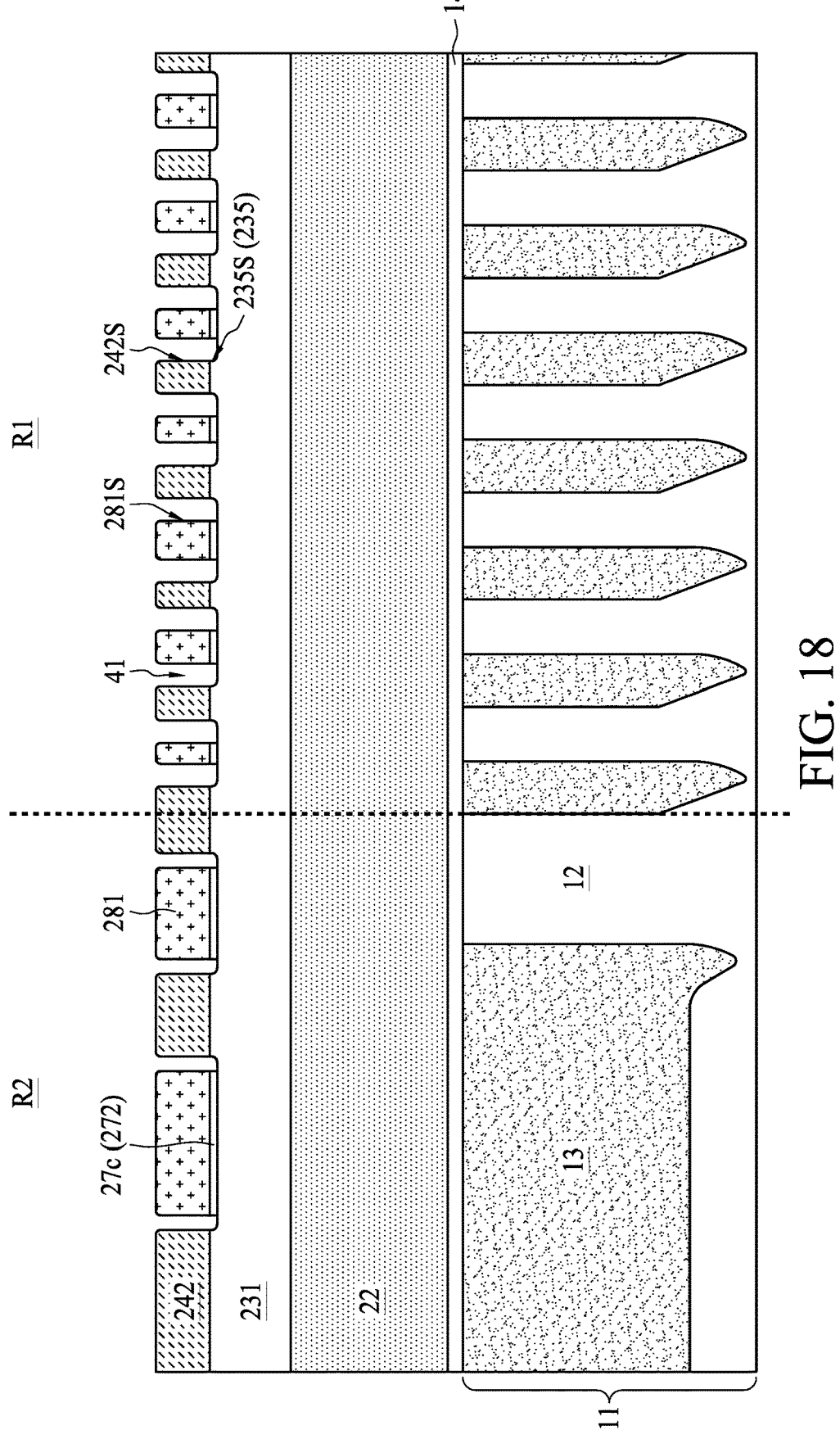

Referring to FIG. 18, FIG. 18 is a schematic cross-sectional diagram along the line A-A' in FIG. 8 at a stage of the method S1, the method S2 and/or the method S3 in accordance with some embodiments of the present disclosure. After the formation of the sixth patterned layer 281 and the third patterned layer 242, a sixth etching operation is performed to remove the vertical portions 27*b* of the patterned conformal layer 27 as shown in FIG. 16 or FIG. 17. In some embodiments, the sixth etching operation includes a selective etching to remove the vertical portions 27*b* of the patterned conformal layer 271 disposed between the third patterned layer 242 and the sixth patterned layer 281. In some embodiments, the sixth etching operation includes ion beam etching, directional dry etching, reactive ion etching, solution wet etching, or a combination thereof. In some embodiments, the sixth etching operation includes a high-selectivity etching. In some embodiments, the sixth etching operation has a high selectivity to the patterned conformal layer 271. In some embodiments, the high selectivity of the sixth etching operation includes an oxide-to-nitride selectivity greater than 10.

In some embodiments as illustrated above, the fourth etching operation stops at the exposure of the third patterned layer 241. In such embodiments, some of the first horizontal portions 27*a* of the conformal layer 27 may remain as residue on the third patterned layer 241. In some embodiments, residues of the first horizontal portions 27*a* of the conformal layer 27 above the third patterned layer 241 are removed by the sixth etching operation concurrently with the vertical portions 27*b* of the conformal layer 27.

As a result, a plurality of gaps 41 are formed between the third patterned layer 242 and the sixth patterned layer 281. In some embodiments, the third patterned layer 242 is separated from the sixth patterned layer 281 by the plurality of gaps 41 and from the second layer 231 by the second horizontal portions 27*c* of the patterned conformal layer 271. In some embodiments, the gaps 41 are at positions from which the vertical portions 27*b* of the patterned conformal layer 271 were previously removed, and thereby sidewalls 242S of portions of the third patterned layer 242 and the sidewalls 235S of the recesses 235 are exposed. In some embodiments, the second horizontal portions 27*c* of the patterned conformal layer 271 disposed between the second layer 231 and the sixth patterned layer 281 remain in place and collectively become a segmental layer 272. In some embodiments, different portions of the segmental layer 272 are separated from each other. In some embodiments, portions of the second layer 231 in the recesses 235 are exposed through the gaps 41. In some embodiments, a width of the gaps 41 is defined by the thickness 275 of the conformal layer 27 shown in FIG. 13. In some embodiments, the width of the gaps 35 is substantially equal to the thickness 275 of the conformal layer 27.

Figure 19:
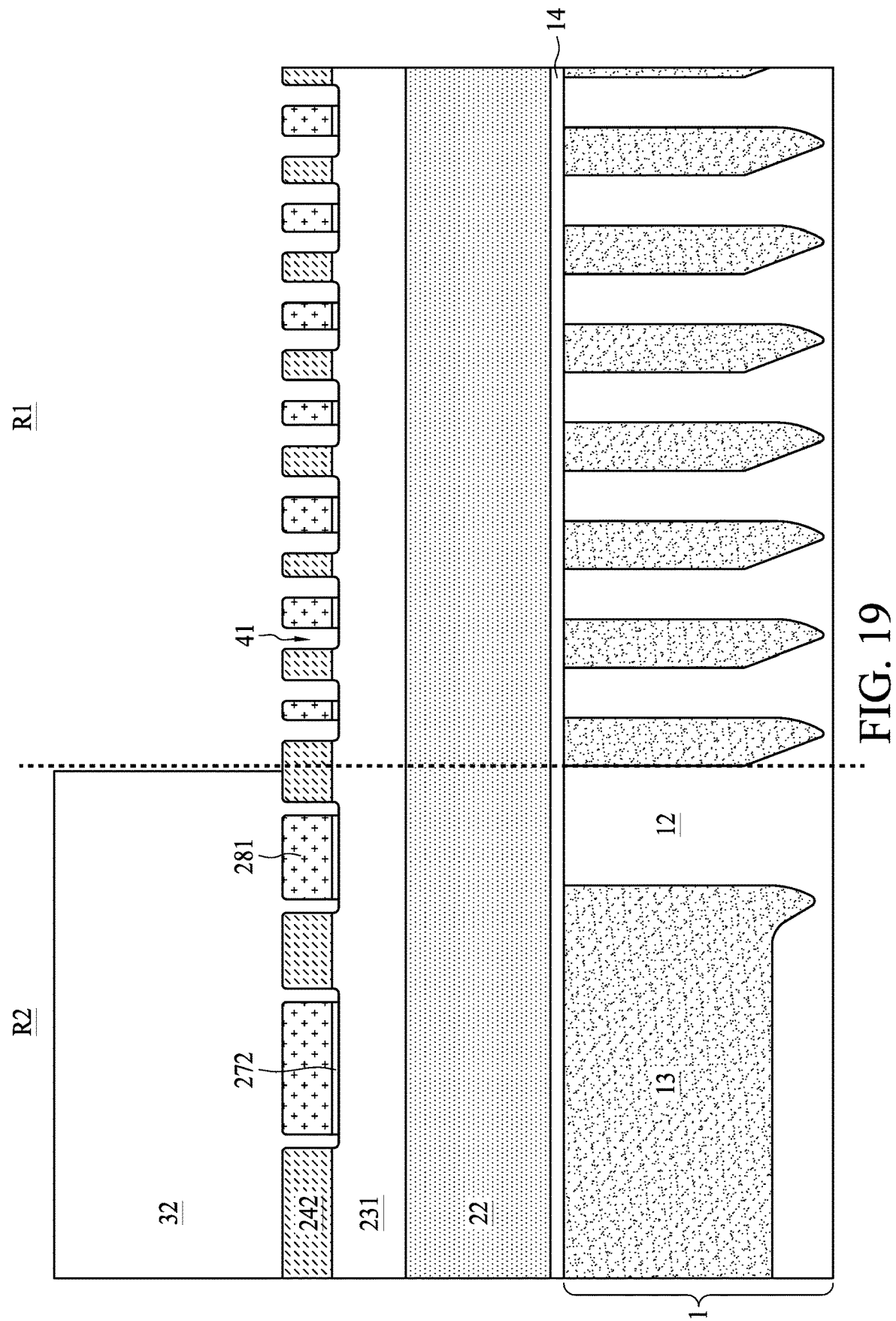

Referring to FIG. 19, FIG. 19 is a schematic cross-sectional diagram along the line A-A' in FIG. 8 at a stage of the method S1, the method S2 and/or the method S3 in accordance with some embodiments of the present disclosure. A second photoresist layer 32 is formed covering the sixth patterned layer 281 and the third patterned layer 242 in the peripheral region R2.

Figure 20:
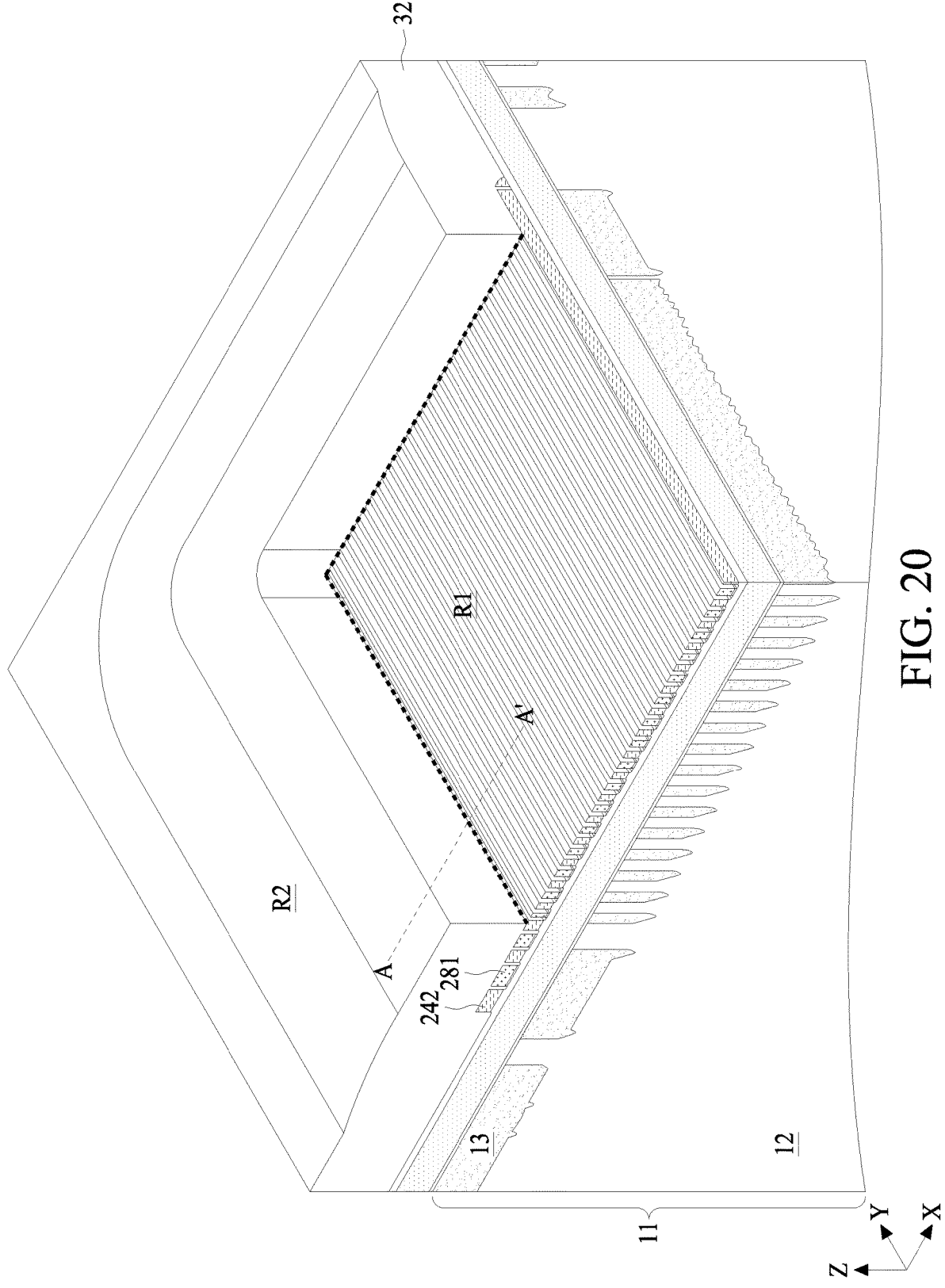
FIG. 20 is a schematic 3D diagram of an intermediate stage in the formation of the semiconductor structure in accordance with some embodiments of the present disclosure.

Referring to FIG. 20, FIG. 20 is a schematic 3D diagram of FIG. 19 in accordance with some embodiments of the present disclosure. Portions of the sixth patterned layer 281 and portions of the third patterned layer 242 in the array region R1 are exposed through the second photoresist layer 32.

Figure 21:
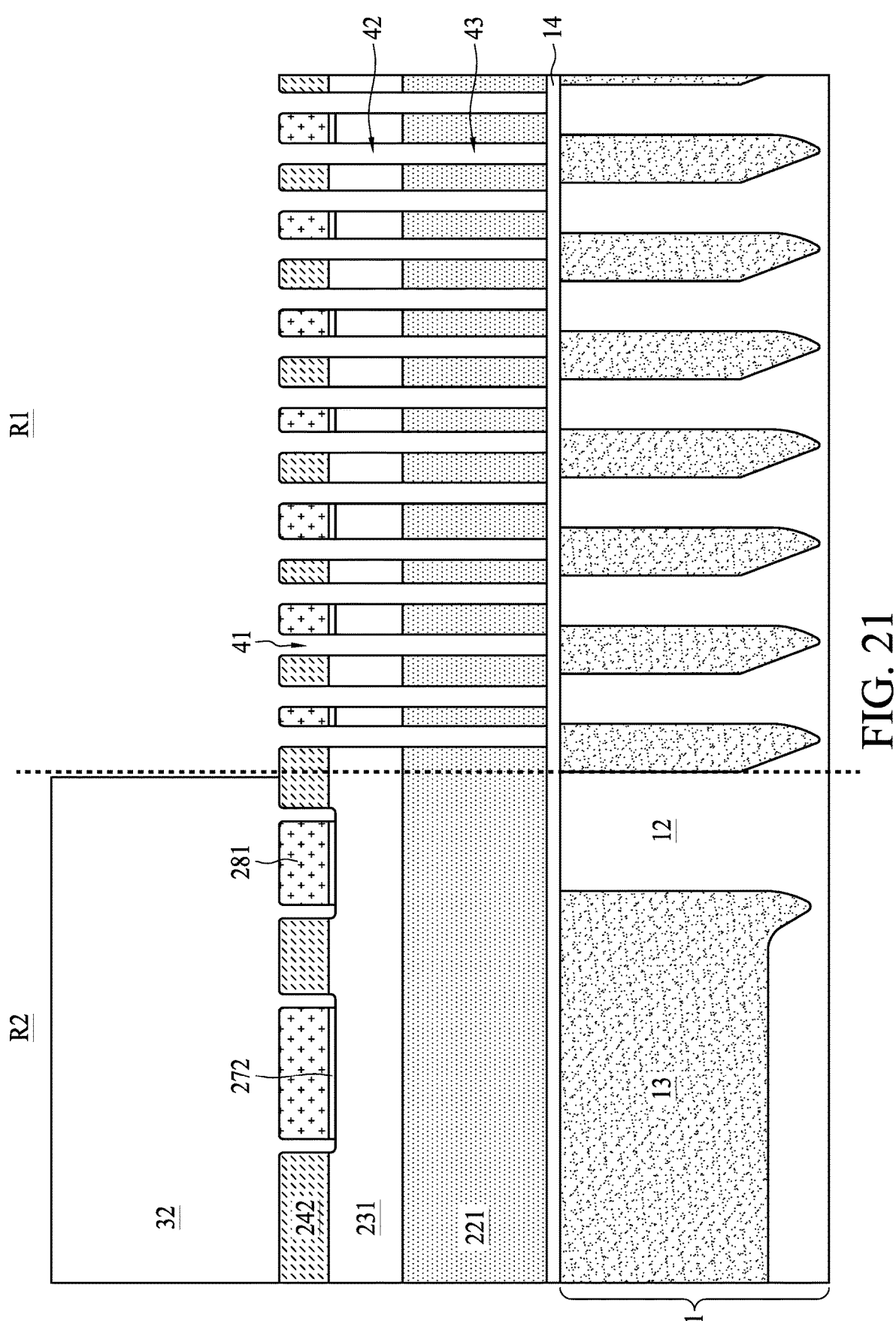
FIGS. 21 to 24 are cross-sectional diagrams of intermediate stages along a line A-A' shown in FIG. 4 in the formation of the semiconductor structure in accordance with some embodiments of the present disclosure.

Referring to FIG. 21, FIG. 21 is a schematic cross-sectional diagram along the line A-A' in FIG. 20 at a stage of the method S1, the method S2 and/or the method S3 in accordance with some embodiments of the present disclosure. A seventh etching operation is performed on the second layer 231 and the first layer 22 in the array region R1 to form a second patterned layer 232 and a first patterned layer 221. A plurality of openings 42 are defined by the second patterned layer 232, and a plurality of openings 43 are defined by the first patterned layer 221. In some embodiments, the seventh etching operation stops at an exposure of the insulating layer 14.

The seventh etching operation may include one or more etching steps. In some embodiments, the seventh etching operation includes an etching step having a low selectivity to materials of the second layer 231 and the first layer 22. In some embodiments, the etching step includes a high selectivity to materials of the second layer 231 and the insulating layer 14. In some embodiments, the etching step includes a high selectivity to materials of the first layer 22 and the insulating layer 14. In some embodiments, the seventh etching operation includes a first etching step targeting the second layer 231 and a second etching step targeting the first layer 22. In some embodiments, the first etching step includes a high selectivity to the materials of the second layer 231 and the first layer 22. In some embodiments, the second etching step is performed after the first etching step and includes a high selectivity to the materials of the first layer 22 and the insulating layer 14. A comprehensive pattern of the third patterned layer 242 and the sixth patterned layer 281 in the array region R1 is therefore transferred to the first layer 22 to from the first patterned layer 221.

Figure 22:
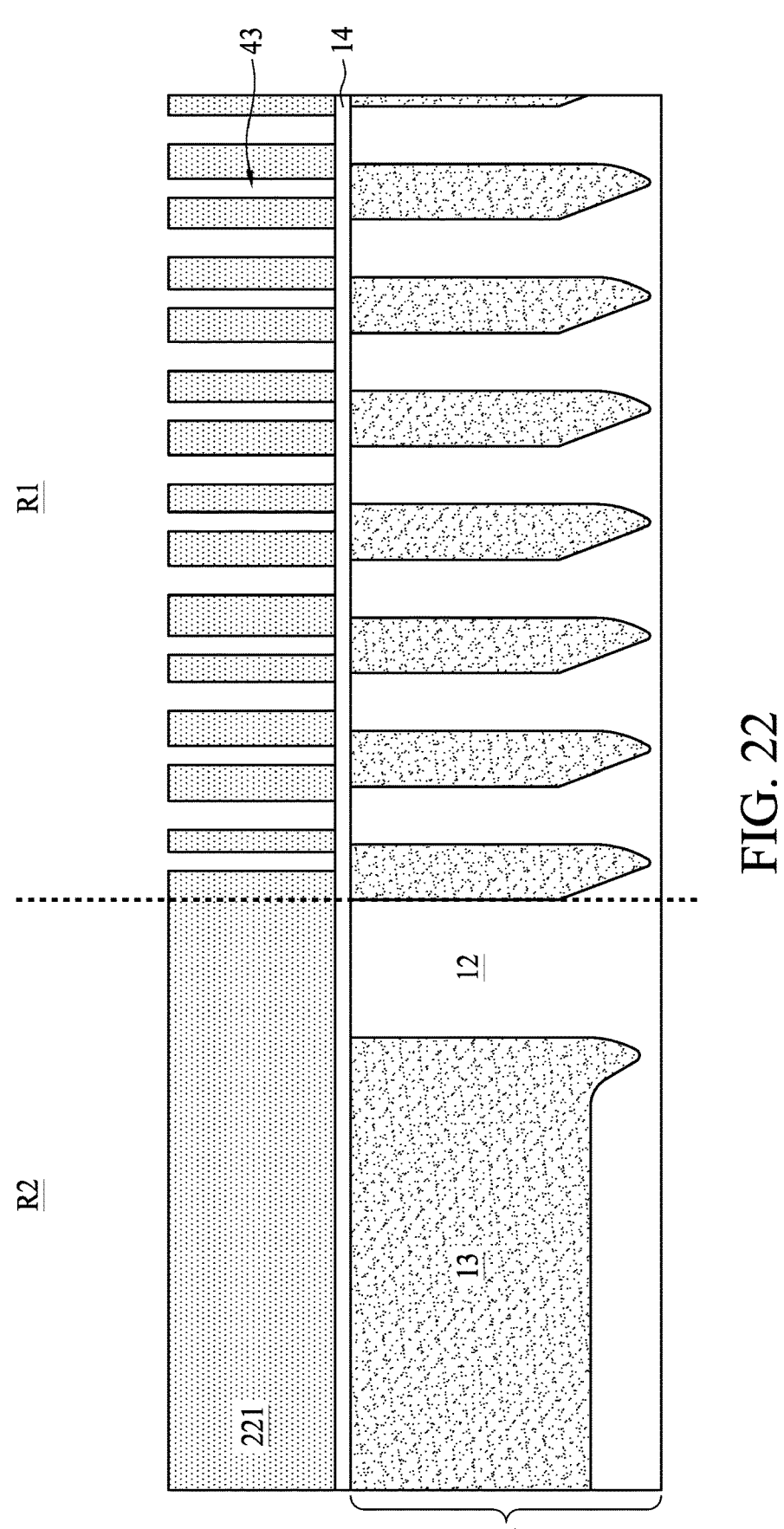

Referring to FIG. 22, FIG. 22 is a schematic cross-sectional diagram along the line A-A' in FIG. 20 at a stage of the method S1, the method S2 and/or the method S3 in accordance with some embodiments of the present disclosure. After the formation of the openings 43 and the first patterned layer 221, the second photoresist layer 32, the third patterned layer 242, the sixth patterned layer 281, the segmental layer 272, and the second patterned layer 232 are removed.

Figure 23:
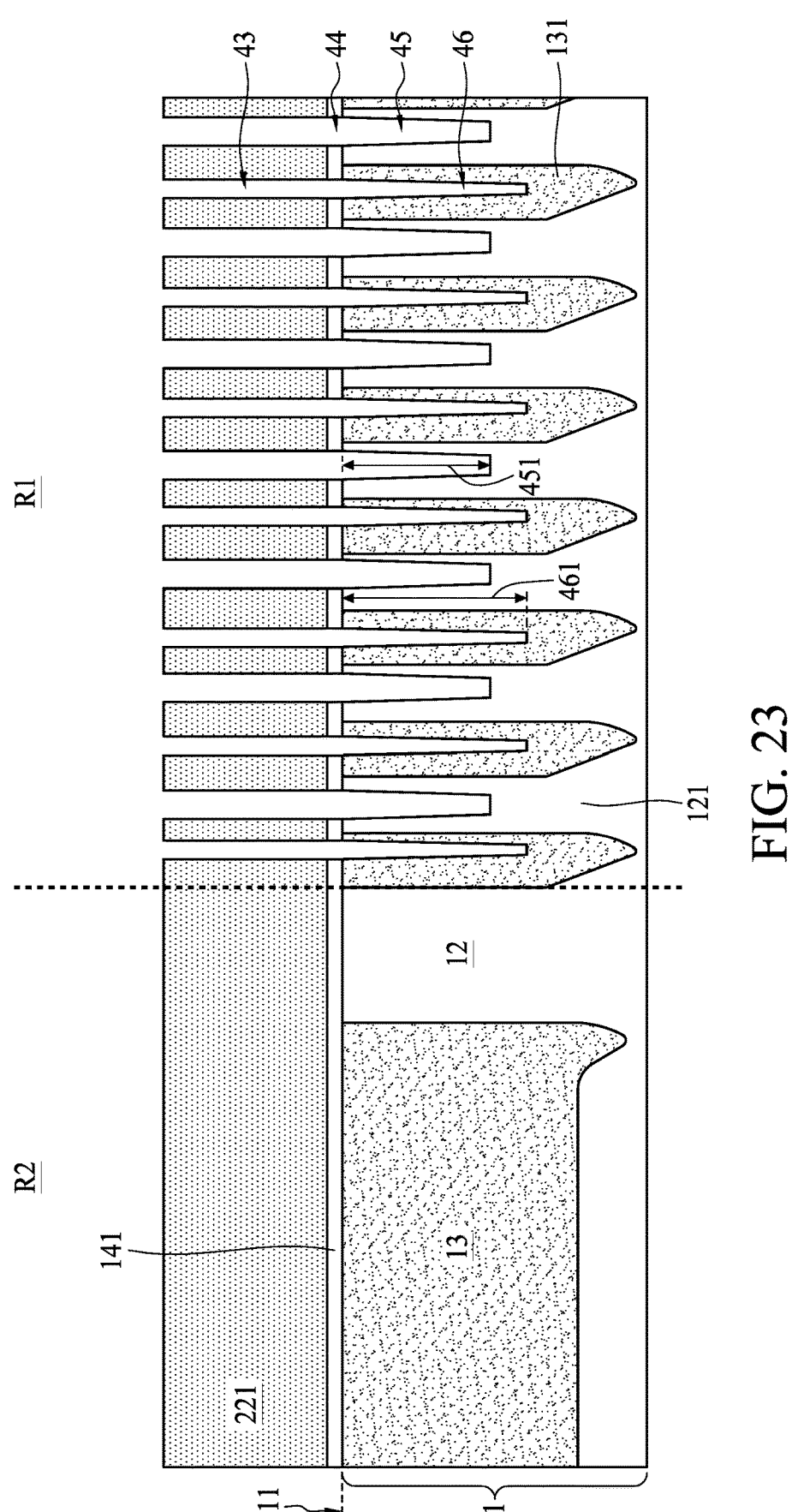

Referring to FIG. 23, FIG. 23 is a schematic cross-sectional diagram along the line A-A' in FIG. 20 at a stage of the method S1, the method S2 and/or the method S3 in accordance with some embodiments of the present disclosure. In the operations S15, S26 and S37, a pattern of the first patterned layer 221 is transferred to the substrate 11. In some embodiments, an eighth etching operation is performed to pattern the insulating layer 14 and the substrate 11. In some embodiments, a plurality of openings 44, a plurality of trenches 45 and a plurality of trenches 46 are formed by the eighth etching operation. In some embodiments, each of the openings 44 penetrates and is surrounded by the insulating layer 14. In some embodiments, the openings 44 are defined by the insulating layer 14. In some embodiments, the trenches 45 are defined by the silicon portions 121 of the substrate 11. In some embodiments, each of the trenches 45 is formed in a silicon portion 121. In some embodiments, the trenches 46 are defined by the dielectric portions 131 of the substrate 11. In some embodiments, each of the trenches 46 is formed in a dielectric portion 131.

Similar to the operations as depicted in FIG. 21, the eighth etching operation includes one or more etching steps, and repeated description is omitted herein. However, such omission is not intended to limit the present disclosure. In some embodiments, a depth 451 of the trench 45 is different from a depth 461 of the trench 46 from the top surface 111 of the substrate 11. In some embodiments, the depth 451 of the trench 45 is substantially less than the depth 461 of the trench 46. In some embodiments, a difference between the depths 451 and 461 is due to different etching rates to different materials of one etching step of the eighth etching operation. In some embodiments, the trenches 45 and the trenches 46 are formed by different etching steps, and the depths 451 and 461 are controlled to be different for a purpose of formation of the WL metals.

Figure 24:
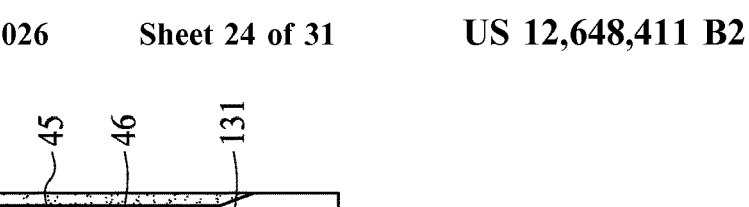

Referring to FIG. 24, FIG. 24 is a schematic cross-sectional diagram along the line A-A' in FIG. 20 at a stage of the method S1, the method S2 and/or the method S3 in accordance with some embodiments of the present disclosure. After the patterning of the substrate 11, the method S1, S2 or S3 may further include removing the first patterned layer 221. In some embodiments, the first patterned layer 221 is removed by an etching operation.

Figure 25:
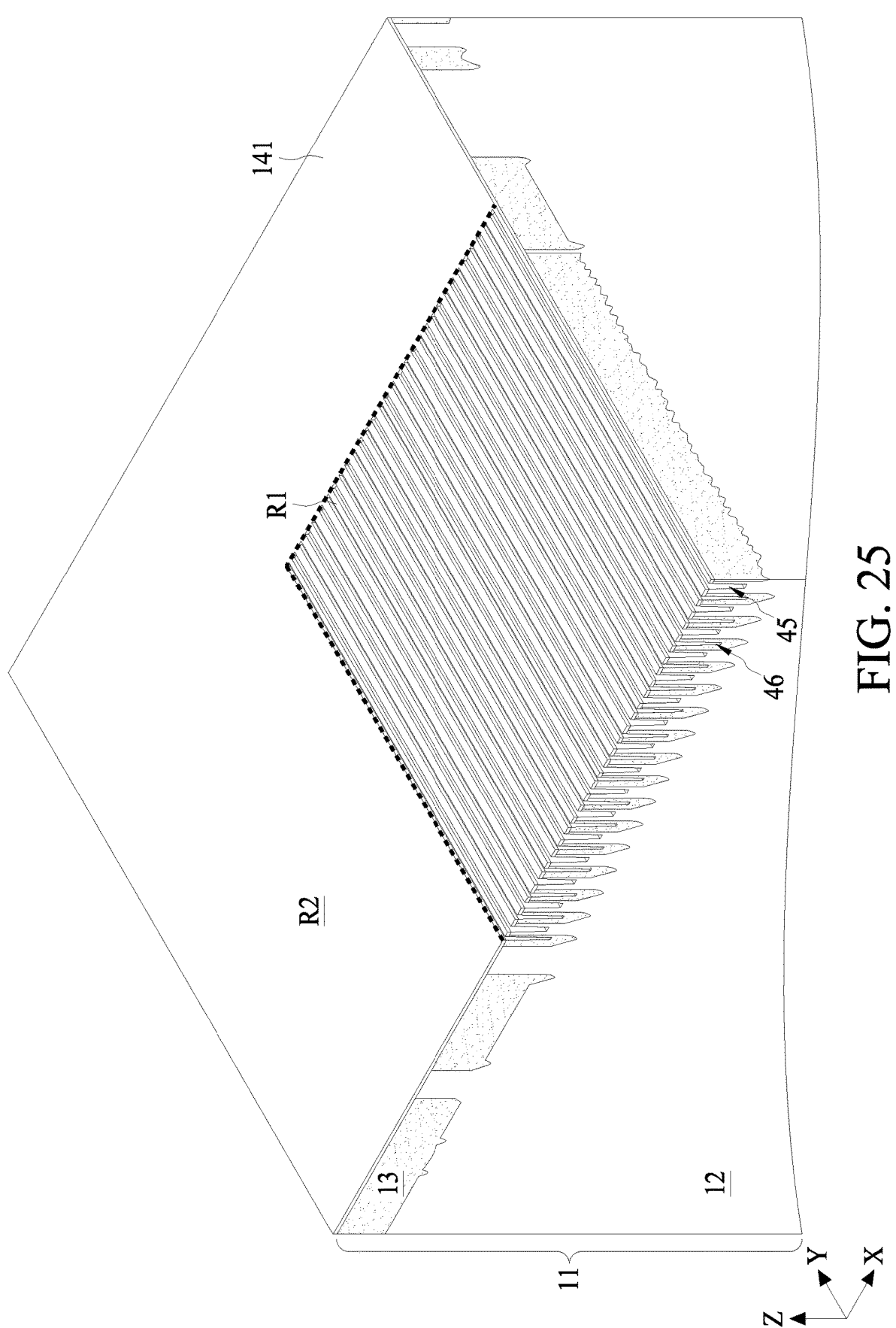
FIG. 25 is a schematic 3D diagram of an intermediate stage in the formation of the semiconductor structure in accordance with some embodiments of the present disclosure.

Referring to FIG. 25, FIG. 25 is a schematic 3D diagram of FIG. 24 in accordance with some embodiments of the present disclosure. The insulating layer 141 covers an entirety of the peripheral region R2, and the openings 44 are formed only in the array region R1.

Figure 26:
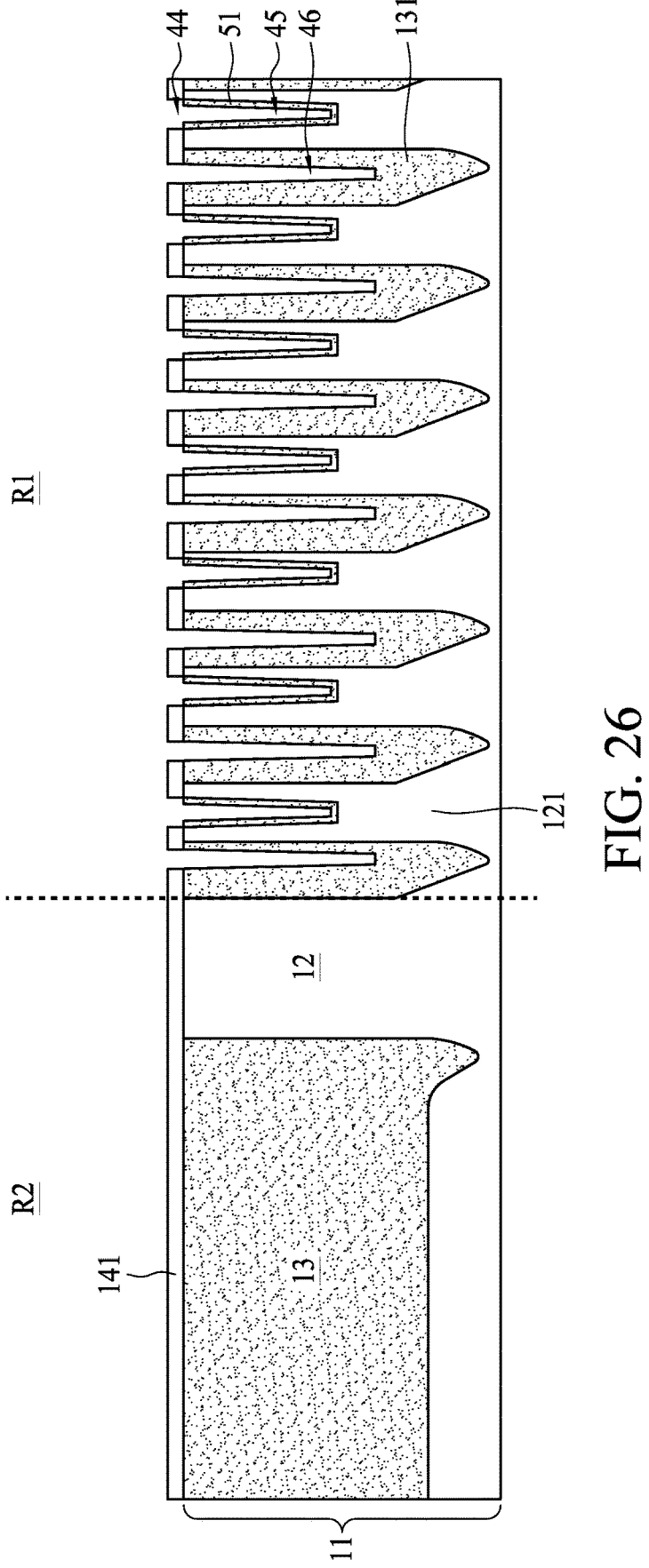
FIGS. 26 to 27 are cross-sectional diagrams of intermediate stages along a line A-A' shown in FIG. 4 in the formation of the semiconductor structure in accordance with some embodiments of the present disclosure.

Referring to FIG. 26, FIG. 26 is a schematic cross-sectional diagram along the line A-A' in FIG. 25 at a stage of the method S1, the method S2 and/or the method S3 in accordance with some embodiments of the present disclosure. After the removal of the first patterned layer 221, the method S1, S2 or S3 may further include forming a dielectric layer 51 lining the trenches 45. In some embodiments, the dielectric layer 51 is formed only in the trenches 45. In some embodiments, the dielectric layer 51 contacts the silicon portions 121. In some embodiments, the dielectric layer 51 is formed by a thermal oxidation. In some embodiments, the dielectric layer 51 includes silicon oxide.

Figure 27:
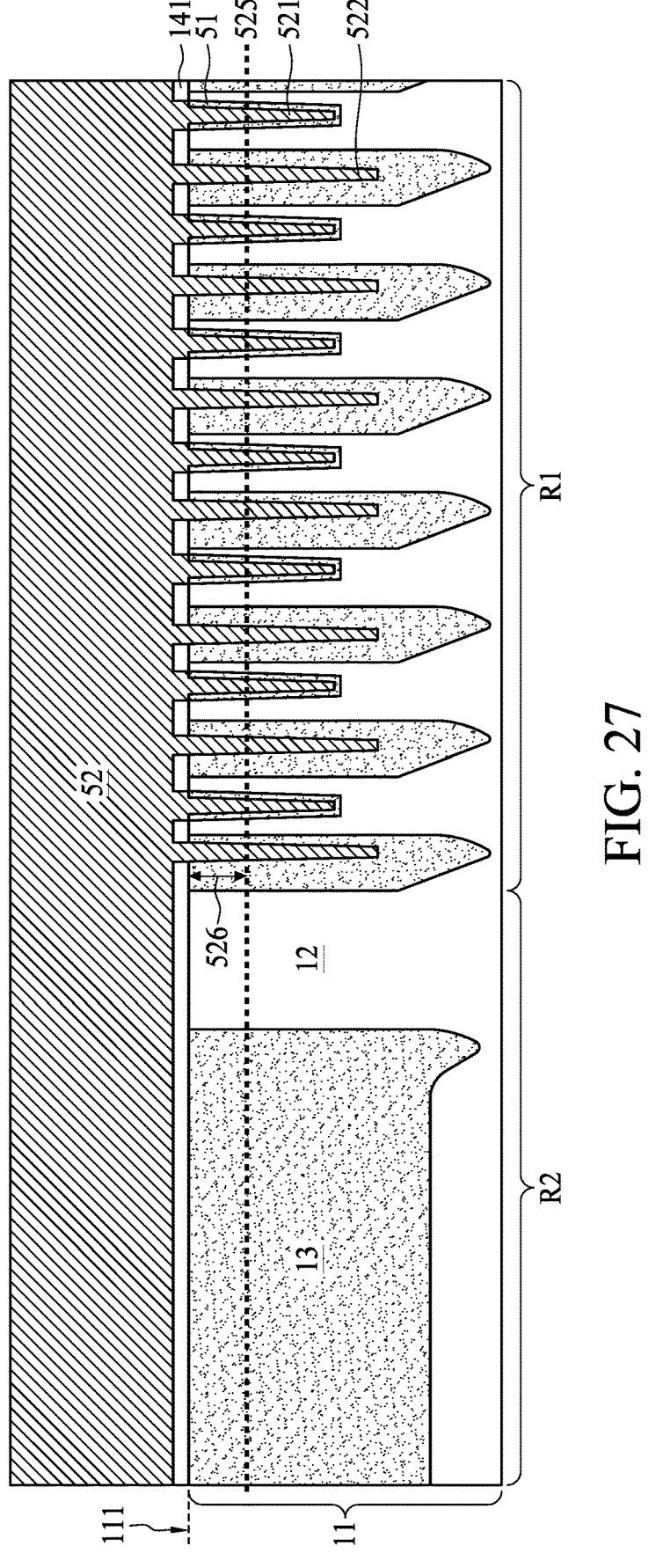

Referring to FIG. 27, FIG. 27 is a schematic cross-sectional diagram along the line A-A' in FIG. 25 at a stage of the method S1, the method S2 and/or the method S3 in accordance with some embodiments of the present disclosure. After the formation of the dielectric layer 51, the method S1, S2 or S3 may further include forming a conductive material 52 over the substrate 11 and the patterned insulating layer 141. The conductive material 52 may fill the openings 44 and the trenches 45 and 46. In some embodiments, the conductive material 52 fills an entirety of the trenches 45 and 46. In some embodiments, the conductive material 52 is formed by a deposition. In some embodiments, the conductive material 52 includes aluminum (Al), copper (Cu), tungsten (W), titanium (Ti), tantalum (Ta), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), titanium nitride (TiN), tungsten nitride (WN), tantalum nitride (TaN), ruthenium (Ru), titanium silicon nitride (TiSiN), other suitable materials, or a combination thereof. In some embodiments, the conductive material 52 is W, TiN, or a combination thereof.

Figure 28:
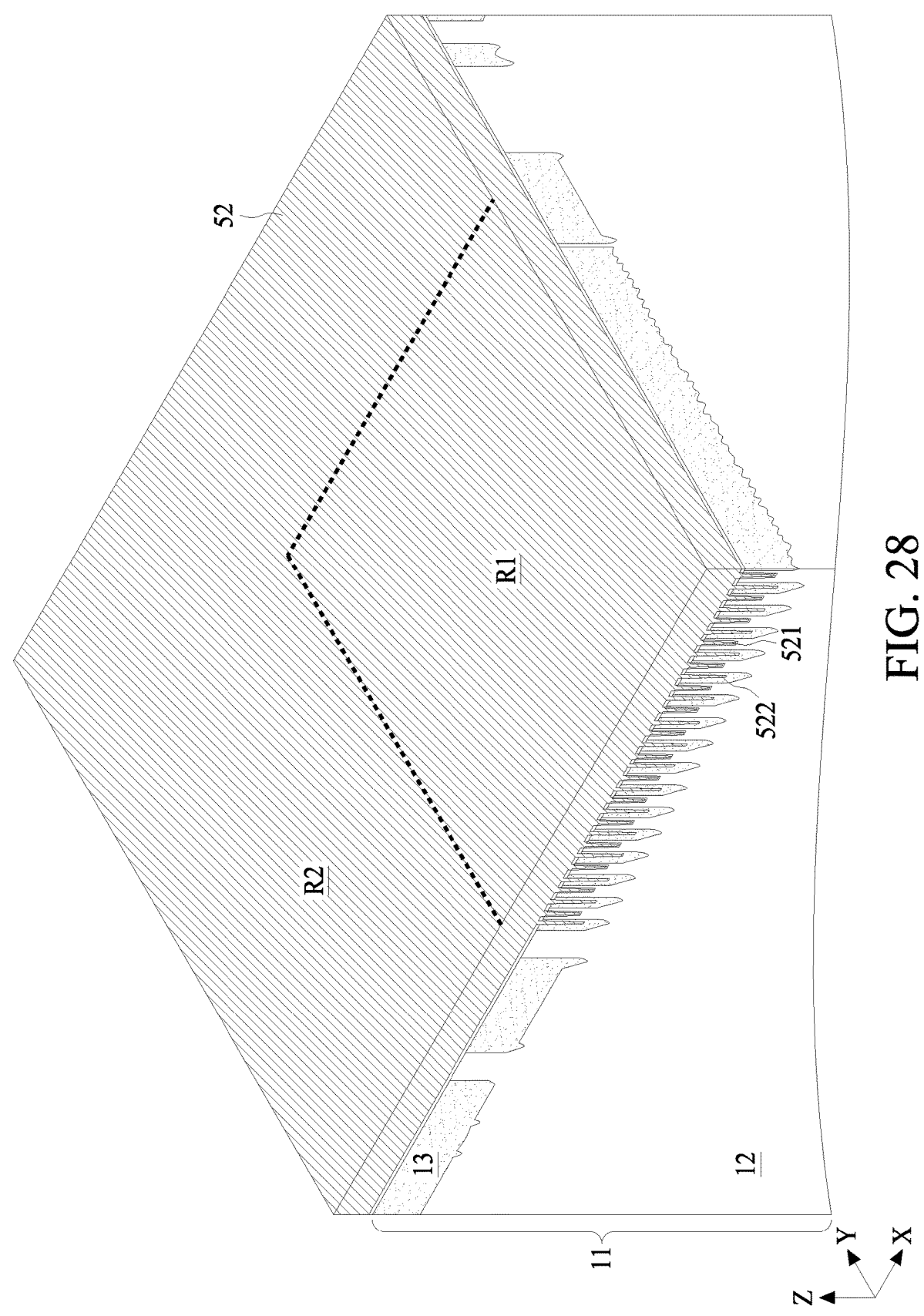
FIG. 28 is a schematic 3D diagram of an intermediate stage in the formation of the semiconductor structure in accordance with some embodiments of the present disclosure.

Referring to FIG. 28, FIG. 28 is a schematic 3D diagram of FIG. 24 in accordance with some embodiments of the present disclosure. The conductive material 52 covers an entirety of the substrate 11 and/or an entirety of the patterned insulating layer 141.

Figure 29:
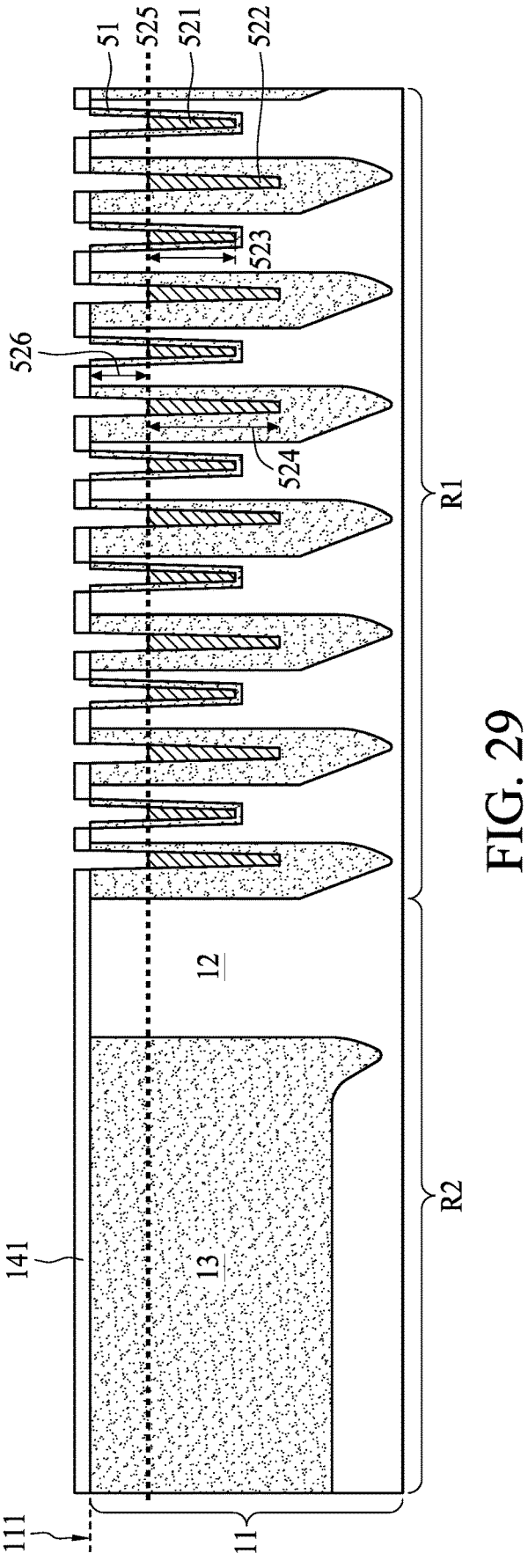
FIG. 29 is a cross-sectional diagram of an intermediate stage along a line A-A' shown in FIG. 4 in the formation of the semiconductor structure in accordance with some embodiments of the present disclosure.

Referring to FIG. 29, FIG. 29 is a schematic cross-sectional diagram along the line A-A' in FIG. 28 at a stage of the method S1, the method S2 and/or the method S3 in accordance with some embodiments of the present disclosure. After the formation of the conductive material 52, the method S1, S2 or S3 may further include removing an upper portion of the conductive material 52. In some embodiments, a plurality of contacts 521 are formed in the trenches and a plurality of contacts 522 are formed in the trenches 46.

Referring back to FIG. 27, a dashed line labeled 525 indicates a designed top surface of the contacts 521 and 522 shown in FIG. 29. For a purpose of electrical connection, the designed top surface 525 should be below the top surface 111 of the substrate 11. In other words, a distance 526 from the top surface 111 of the substrate 11 to the designed top surface 525 should be greater than zero. However, a range of the distance 526 can be adjusted according to different applications, and it is not limited herein. In addition, it should be noted that the figures are for a purpose of illustration, and tops of different contacts 521 and/or 522 can be at roughly a same elevation but necessarily at a same horizontal level. In some embodiments, a height 523 of the contacts 521 and a height 524 of the contacts 522 from the designed top surface 525 are different due to different depths 451 and 461 of the trenches 45 and 46 shown in FIG. 23. In some embodiments, the height 523 of the contacts 521 is substantially less than the height 524 of the contacts 522 from the designed top surface 525.

Figure 30:
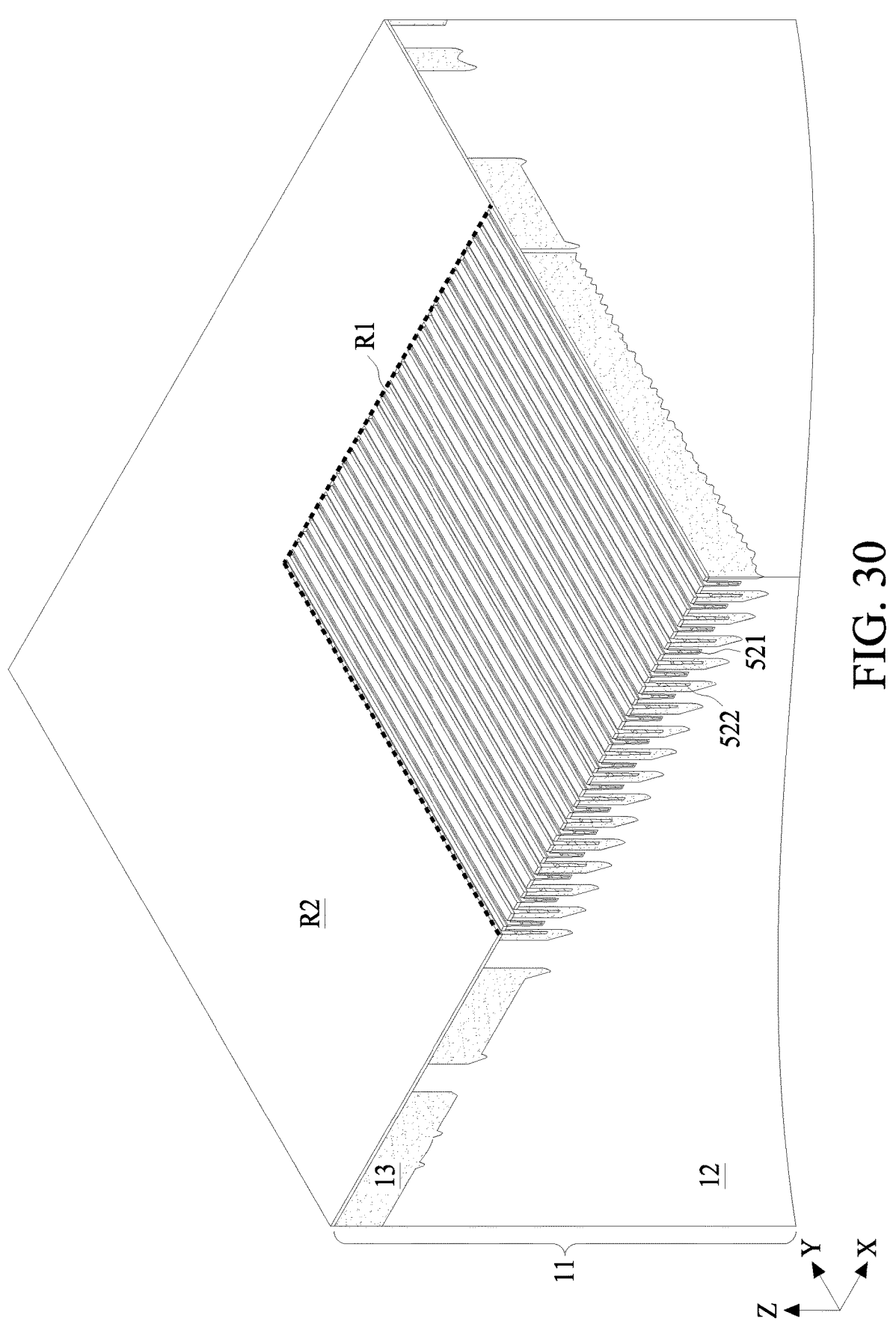
FIG. 30 is a schematic 3D diagram of an intermediate stage in the formation of the semiconductor structure in accordance with some embodiments of the present disclosure.

Referring to FIG. 30, FIG. 30 is a schematic 3D diagram of FIG. 24 in accordance with some embodiments of the present disclosure. The contacts 521 and 522 are formed only in the array region R1. In some embodiments, the contacts 521 and 522 extend alternately along the Y direction.

Figure 31:
FIG. 31 is a cross-sectional diagram of an intermediate stage along a line A-A' shown in FIG. 4 in the formation of the semiconductor structure in accordance with some embodiments of the present disclosure.

Referring to FIG. 31, FIG. 31 is a schematic cross-sectional diagram along the line A-A' in FIG. 20 at a stage of the method S1, the method S2 and/or the method S3 in accordance with some embodiments of the present disclosure. After the formation of the contacts 521 and 522, the method S1, S2 or S3 may further include forming a first dielectric layer 53 and a second dielectric layer 54 over the substrate 11.

The first dielectric layer 53 and the second dielectric layer 54 may be sequentially formed over the substrate 11 covering the contacts 521 and 522 and the patterned insulating layer 141. In some embodiments, the first dielectric layer 53 and the second dielectric layer 54 include different dielectric materials. In some embodiments, the first dielectric layer 53 includes nitride (e.g., silicon nitride), and the second dielectric layer 54 includes oxide (e.g., silicon oxide). In some embodiments, the first dielectric layer 53 fills the trenches 45 above the contacts 521. In some embodiments, the first dielectric layer 53 fills the trenches 46 above the contacts 522. In some embodiments, the first dielectric layer 53 fills the openings 44. In some embodiments, the first dielectric layer 53 covers an entirety of the patterned insulating layer 141. In some embodiments, the second dielectric layer 54 covers an entirety of the first dielectric layer 53. The semiconductor structure 10 is thereby formed.

Therefore, the present disclosure provides a novel configuration of a multi-layer structure used in manufacturing a semiconductor structure. The multi-layer structure of the present disclosure includes a semiconductive material layer over an amorphous silicon layer between two carbon layers. Due to material properties, a combination of the multi-layer structure can prevent an issue of wiggling patterns that arises with a conventional multi-layer stack. A performance of a device formed according to the method and a product yield can thereby be improved.

One aspect of the present disclosure provides a method for manufacturing a semiconductor structure. The method includes a number of operations. A substrate is provided. A multi-layer structure is formed over the substrate, wherein the multi-layer structure includes a semiconductive material layer and an oxide layer over the semiconductive material layer. The oxide layer is patterned to form a first patterned layer. A second patterned layer is formed on the semiconductive material layer and alternately arranged with the first patterned layer. A first etching operation is performed on the substrate using a comprehensive pattern of the first patterned layer and the second patterned layer.

Another aspect of the present disclosure provides a method for manufacturing a semiconductor structure. The method includes a number of operations. A substrate is provided. A multi-layer structure is formed over the substrate, wherein the multi-layer structure includes a first carbon layer, a silicon layer, an oxide layer, and a second carbon layer sequentially arranged over the substrate. The second carbon layer is patterned to form a first patterned carbon layer. The oxide layer is patterned using the first patterned carbon layer as a mask to form a first patterned oxide layer. A second patterned oxide layer is formed, wherein portions of the second patterned oxide layer are separated from and alternately arranged with portions of the first patterned oxide layer. A pattern of the first patterned oxide layer and the second patterned oxide layer is transferred to the substrate.

Another aspect of the present disclosure provides a method for manufacturing a semiconductor structure. The method includes a number of operations. A substrate including an array region and a peripheral region surrounding the array region is provided. A multi-layer structure is formed over the substrate, wherein the multi-layer structure includes a silicon layer and an oxide layer over the silicon layer. A first photoresist layer is formed over the multi-layer structure. A critical dimension (CD) of the first photoresist layer is reduced. After the reduction of the CD, a pattern of the first photoresist layer is transferred to the oxide layer to form a first patterned oxide layer. A second patterned oxide layer is formed over the silicon layer. A pattern of the first patterned oxide layer and a pattern of the second patterned oxide layer are transferred to the substrate.

In conclusion, the application discloses a manufacturing method of a semiconductor structure and a semiconductor structure thereof. The present disclosure provides a novel structure of a multi-layer structure used in patterning a substrate. The multi-layer structure of the present disclosure includes a semiconductive material layer over an amorphous silicon layer between two carbon layers. Due to material properties, a combination of the multi-layer structure can prevent an issue of wiggling patterns that arises in a conventional multi-layer stack. A performance of a device formed according to the method and a product yield can thereby be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method for manufacturing a semiconductor structure, comprising:

providing a substrate;

forming a multi-layer structure over the substrate, wherein the multi-layer structure includes a first carbon layer, a silicon layer, an oxide layer, and a second carbon layer sequentially arranged over the substrate;

patterning the second carbon layer to form a first patterned carbon layer;

patterning the oxide layer using the first patterned carbon layer as a mask to form a first patterned oxide layer, wherein the first patterned oxide layer is extended from a top surface of the silicon layer;

forming a recess on the top surface of the silicon layer adjacent to the first pattern oxide layer by removing a surficial portion of the silicon layer;

forming a second patterned oxide layer on the recess, wherein portions of the second patterned oxide layer are separated from and alternately arranged with portions of the first patterned oxide layer; and transferring a pattern of the first patterned oxide layer and the second patterned oxide layer to the substrate.

2. The method of claim 1, wherein the transfer of the pattern comprises:

patterning the silicon layer using the first patterned oxide layer and the second patterned oxide layer as a mask to form a patterned silicon layer;

patterning the first carbon layer using the patterned silicon layer as a mask to form a second patterned carbon layer; and patterning the substrate using the second patterned carbon layer as a mask.

3. The method of claim 1, wherein the silicon layer includes amorphous silicon, wherein the portions of the first patterned oxide layer are in contact with the top surface of the silicon layer while the portions of the second patterned oxide layer are spaced apart from the top surface of the silicon layer.

4. The method of claim 1, wherein the transfer of the pattern comprises:

performing a first etching operation to form a first trench within a silicon portion of the substrate, wherein the silicon portion is made of a silicon material; and performing a second etching operation to form a second trench within a dielectric portion of the substrate, wherein the dielectric portion is made of a dielectric material;

wherein the silicon portion is alternately arranged with the dielectric portion.

5. The method of claim 4, wherein a first depth of the first trench is substantially less than a second depth of the second trench.

6. The method of claim 4, further comprising:

forming a dielectric layer lining the first trench; and depositing a conductive material in the first trench and the second trench.

7. The method of claim 4, further comprising:

removing an upper portion of the conductive material to form a plurality of contacts in the first trench and the second trench;

forming a nitride layer over the conductive material; and forming an oxide layer over the nitride layer.

8. The method of claim 7, wherein the nitride layer fills the first trench and the second trench above the plurality of contacts.

9. The method of claim 1, further comprising forming a patterned conformal layer in the recess, wherein the patterned conformal layer is formed between the portions of the second patterned oxide layer are spaced apart from the top surface of the silicon layer, wherein a thickness of the first carbon layer is substantially greater than a thickness of the silicon layer or a thickness of the oxide layer.

* * * * *